US012376363B2

(12) United States Patent
Cheng et al.

(10) Patent No.: US 12,376,363 B2
(45) Date of Patent: Jul. 29, 2025

(54) GATE STACKS FOR STACK-FIN CHANNEL I/O DEVICES AND NANOWIRE CHANNEL CORE DEVICES

(71) Applicant: Taiwan Semiconductor Manufacturing Co., Ltd., Hsin-Chu (TW)

(72) Inventors: Chao-Ching Cheng, Hsinchu (TW); Wei-Sheng Yun, Taipei (TW); I-Sheng Chen, Hsinchu (TW); Shao-Ming Yu, Hsinchu County (TW); Tzu-Chiang Chen, Hsinchu (TW); Chih Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 268 days.

(21) Appl. No.: 16/713,986

(22) Filed: Dec. 13, 2019

(65) Prior Publication Data
US 2020/0119155 A1    Apr. 16, 2020

Related U.S. Application Data

(60) Continuation of application No. 16/201,523, filed on Nov. 27, 2018, now Pat. No. 11,152,481, which is a
(Continued)

(51) Int. Cl.
*H10D 84/83*    (2025.01)
*H10D 30/62*    (2025.01)
(Continued)

(52) U.S. Cl.
CPC .......... *H10D 64/685* (2025.01); *H10D 30/62* (2025.01); *H10D 62/235* (2025.01);
(Continued)

(58) Field of Classification Search
CPC ..... H01L 21/823412; H01L 21/823807; H01L 21/823431; H01L 21/823821;
(Continued)

(56) References Cited

U.S. PATENT DOCUMENTS 6,586,349 B1 *  7/2003  Jeon .................. H01L 21/02142
                                                      438/785
8,685,820 B2    4/2014  Tseng et al.
(Continued)

FOREIGN PATENT DOCUMENTS

CN    102104042 A    6/2011
CN    102822959 A    12/2012
(Continued)

OTHER PUBLICATIONS

Lippy, S. et al., "TIN Metal Hard Mask Removal with Selectivity to Tungsten and TIN Liner", Oct. 29, 2013, ECS Transactions, 58 (6), pp. 261-266.
(Continued)

*Primary Examiner* — Yu Chen
(74) *Attorney, Agent, or Firm* — HAYNES AND BOONE, LLP

(57) ABSTRACT

A semiconductor device includes a substrate having an I/O region and a core region; a first transistor in the I/O region; and a second transistor in the core region, wherein the first transistor includes a first gate structure having: an interfacial layer; a first high-k region over the interfacial layer; and a conductive layer over the first high-k region, wherein the second transistor includes a second gate structure having: the interfacial layer; a second high-k region over the interfacial layer; and the conductive layer over the second high-k region, and where in the first high-k region is thicker than the second high-k region.

20 Claims, 34 Drawing Sheets

Related U.S. Application Data division of application No. 15/719,686, filed on Sep. 29, 2017, now Pat. No. 10,804,367.

(51) Int. Cl.
  *H10D 62/17* (2025.01)
  *H10D 64/68* (2025.01)
  *H10D 84/01* (2025.01)
  *H10D 84/03* (2025.01)
  *H10D 84/85* (2025.01)
  *H10D 64/01* (2025.01)

(52) U.S. Cl.
  CPC ..... *H10D 84/0128* (2025.01); *H10D 84/0144* (2025.01); *H10D 84/0167* (2025.01); *H10D 84/0177* (2025.01); *H10D 84/0181* (2025.01); *H10D 84/0193* (2025.01); *H10D 84/038* (2025.01); *H10D 84/8311* (2025.01); *H10D 84/8314* (2025.01); *H10D 84/832* (2025.01); *H10D 84/834* (2025.01); *H10D 84/853* (2025.01); *H10D 84/856* (2025.01); *H10D 64/017* (2025.01); *H10D 84/0158* (2025.01)

(58) Field of Classification Search
  CPC ..... H01L 21/823462; H01L 21/823857; H01L 27/0922; H01L 27/0886; H01L 27/0924; H01L 29/0673; H01L 29/66439; H01L 29/775; H01L 29/78696; H01L 29/42392; H01L 29/511; H01L 29/513; H01L 29/165
  See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,412,849 B1 | 8/2016 | Suk et al. | |
| 9,449,975 B1 | 9/2016 | Ching et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2006/0237784 A1* | 10/2006 | Rahim | H01L 27/0922 257/E27.11 |
| 2007/0001241 A1 | 1/2007 | Lim et al. | |
| 2007/0178637 A1* | 8/2007 | Jung | H01L 21/823857 438/216 |
| 2011/0121399 A1 | 5/2011 | Park et al. | |
| 2012/0045876 A1* | 2/2012 | Kawahara | H01L 21/823857 438/231 |
| 2012/0052645 A1* | 3/2012 | Haneda | H01L 21/28088 257/E21.409 |
| 2012/0139055 A1* | 6/2012 | Sato | H01L 21/02332 257/369 |
| 2012/0313158 A1* | 12/2012 | Yin | H01L 29/518 257/316 |
| 2013/0021840 A1* | 1/2013 | Tokita | G11C 11/412 365/156 |
| 2013/0175577 A1 | 7/2013 | Tan et al. | |
| 2013/0175630 A1 | 7/2013 | Ando et al. | |
| 2013/0285116 A1 | 10/2013 | Lochtefeld et al. | |
| 2013/0285150 A1 | 10/2013 | Chen et al. | |
| 2013/0285151 A1 | 10/2013 | Wu et al. | |
| 2013/0299913 A1 | 11/2013 | Lin et al. | |
| 2013/0299922 A1* | 11/2013 | Choi | H01L 29/4966 438/585 |
| 2014/0027859 A1 | 1/2014 | Gerhardt et al. | |
| 2016/0240681 A1 | 8/2016 | Ching et al. | |
| 2016/0315080 A1 | 10/2016 | Song et al. | |
| 2017/0053915 A1 | 2/2017 | Ando et al. | |
| 2017/0117372 A1 | 4/2017 | Li et al. | |
| 2017/0140933 A1 | 5/2017 | Lee et al. | |
| 2017/0256544 A1* | 9/2017 | Chai | H01L 29/401 |
| 2018/0090569 A1* | 3/2018 | Yang | H01L 27/0207 |

FOREIGN PATENT DOCUMENTS

| | | | | |
|---|---|---|---|---|
| CN | 103531453 A | | 1/2014 | |
| CN | 105762190 A | | 7/2016 | |
| CN | 105895693 A | | 8/2016 | |
| CN | 106653691 A | | 5/2017 | |
| DE | 102014110425 | | 2/2015 | |
| JP | 2011253931 | | 12/2011 | |
| KR | 20130018102 | | 2/2013 | |
| KR | 20170069888 | | 6/2017 | |
| WO | WO-2011027487 A1 * | | 3/2011 | ........ H01L 21/02178 |

OTHER PUBLICATIONS

Saraswat, "Thin Dielectrics for MOS Gate", EE 311 Notes, Stanford University, https://web.standford.edu/class/ee311/NOTES/GateDielectric.pdf, publication date unknown, downloaded from the internet Aug. 8, 2017, 46 pages.

* cited by examiner

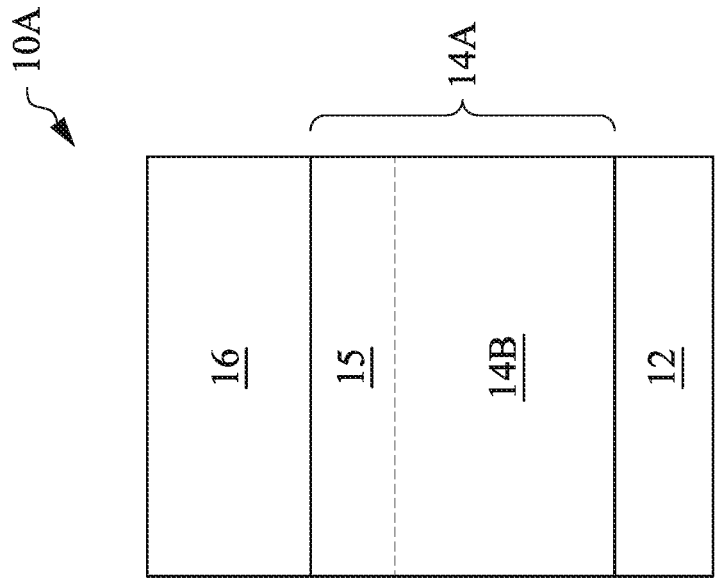
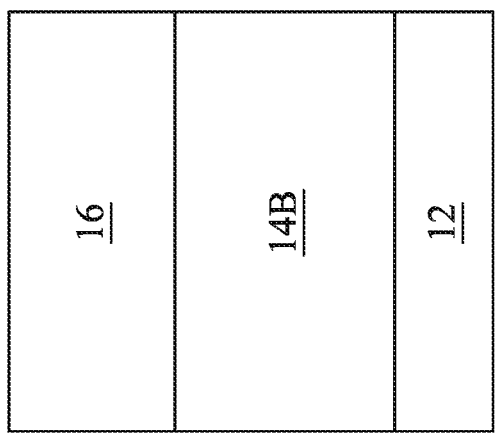
FIG. 1

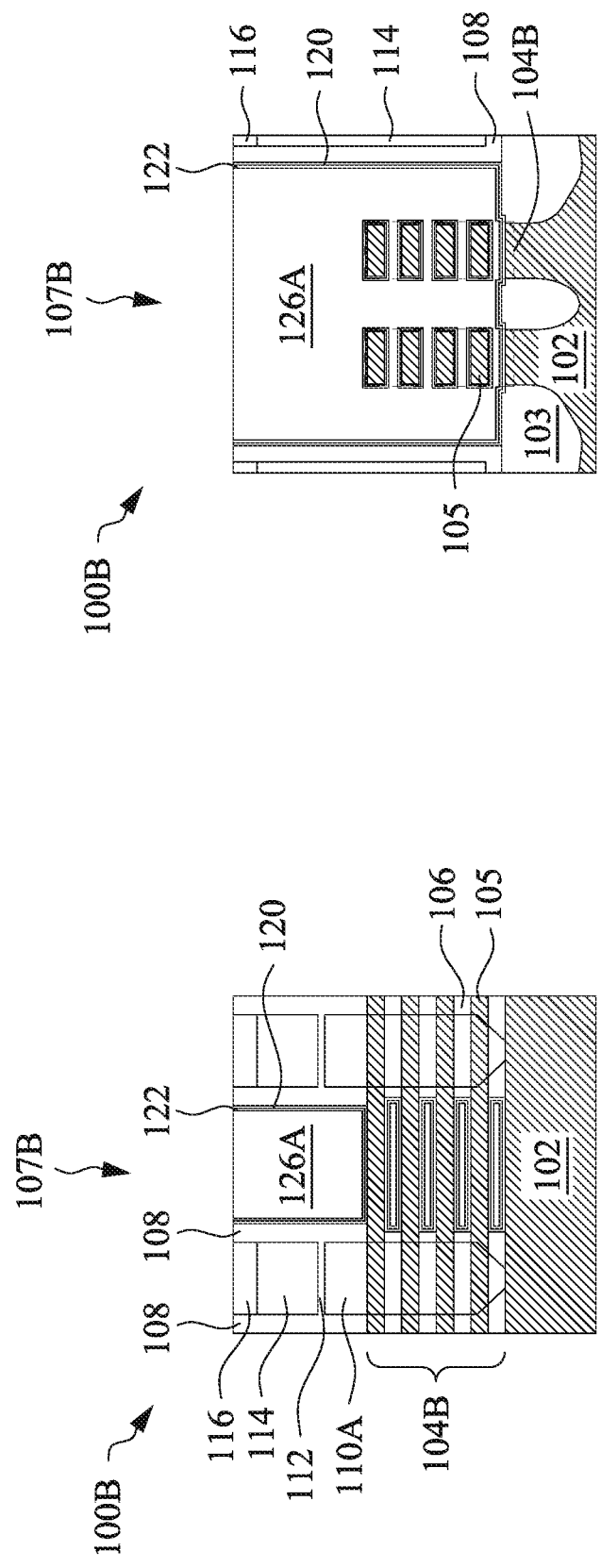

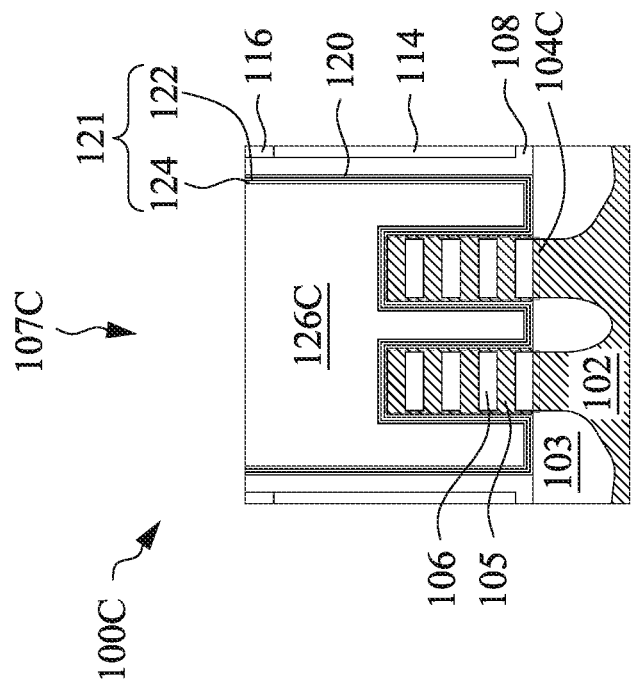
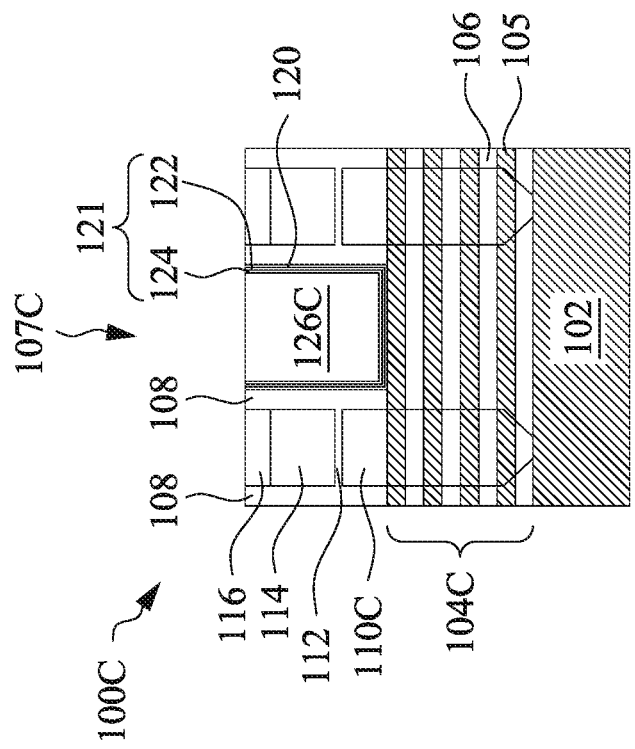
FIG. 4B
FIG. 4A

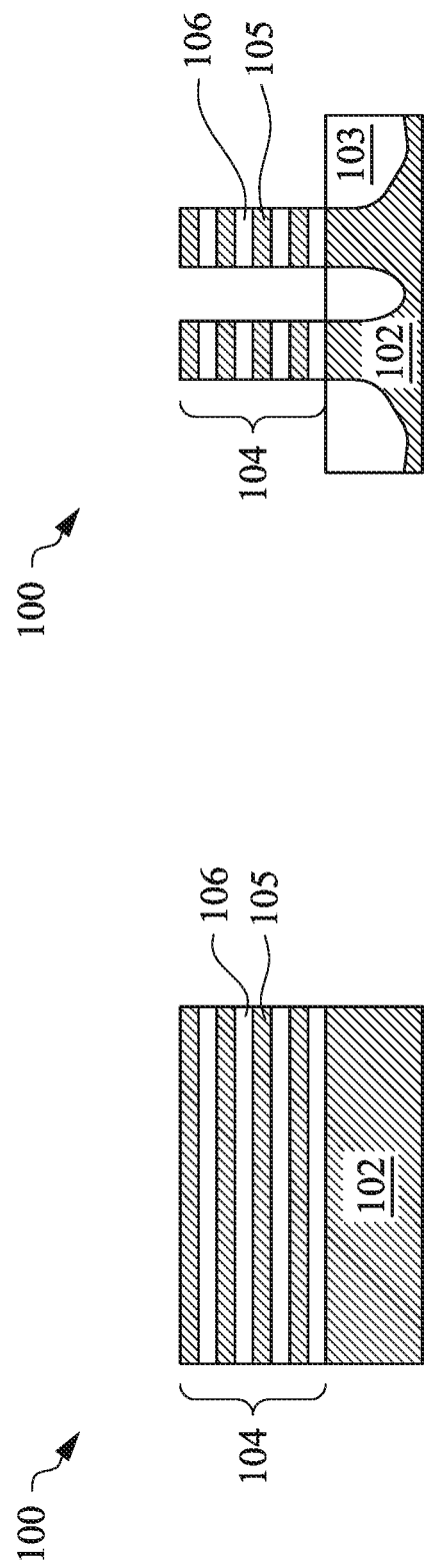

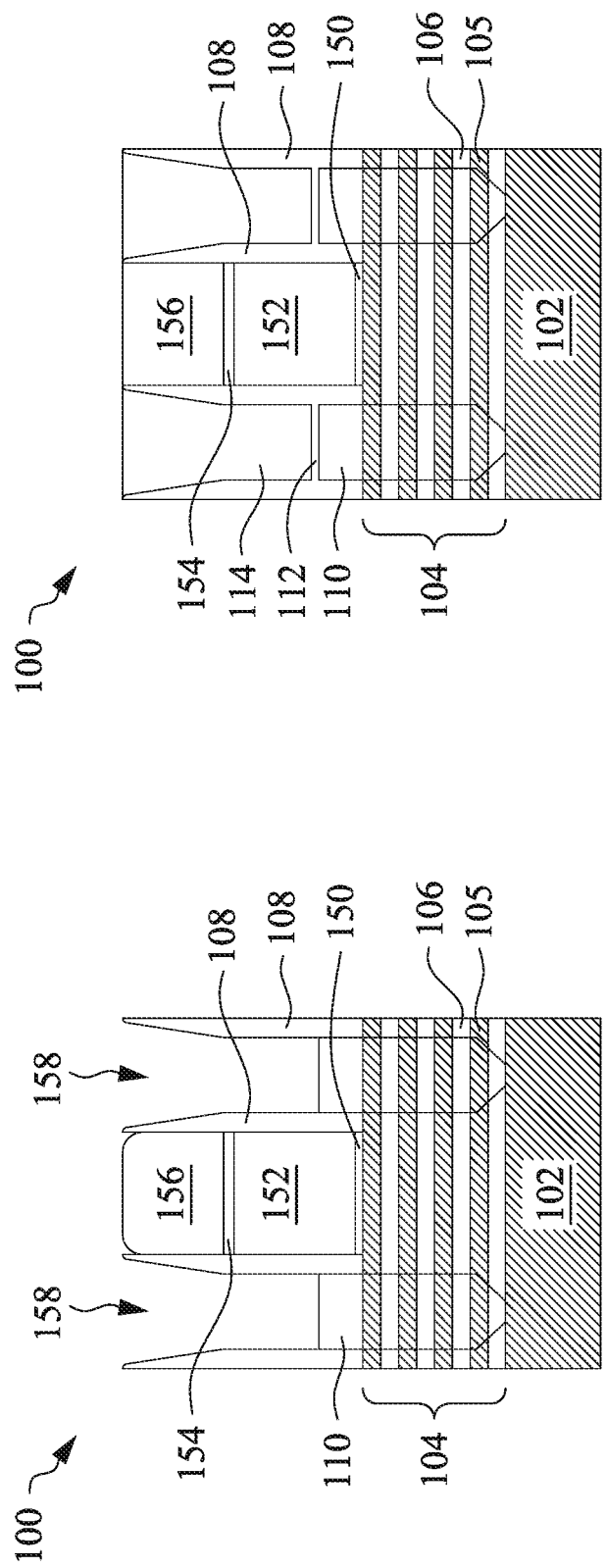

US 12,376,363 B2

1

GATE STACKS FOR STACK-FIN CHANNEL I/O DEVICES AND NANOWIRE CHANNEL CORE DEVICES

PRIORITY

This is a continuation application of U.S. patent application Ser. No. 16/201,523, which is a divisional application of U.S. patent application Ser. No. 15/719,686, filed Sep. 29, 2017, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the scaling down continues, source/drain (S/D) junction becomes more important for short channel control and determines final device performance. Therefore, low thermal processes after S/D formation are required. But, existing gate oxide processes typically use post oxide annealing (POA), which is usually a high and long thermal process, in order to produce high-quality gate oxide. This POA process sometimes compromises the S/D junction performance. How to form gate stacks with a low thermal process and with sufficient reliability is an important task. For another example, as I/O (input/output or IO) devices operate at higher Vdd than core devices, a thicker gate oxide is required for I/O devices. How to continuously scale down gate stacks for I/O devices is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a schematic view of two gate stacks for I/O devices and core devices, according to aspects of the present disclosure.

FIGS. 3A and 3B show two cross-sectional views of an NFET core device, according to aspects of the present disclosure.

FIGS. 4A and 4B show two cross-sectional views of a PFET (p-type field effect transistor) I/O device, according to aspects of the present disclosure.

2

Figure 5B:
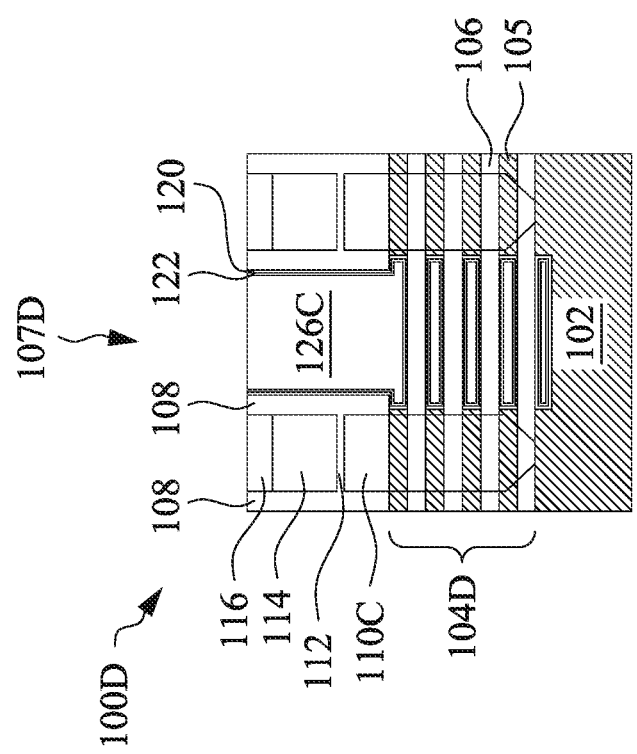
Figure 5A:
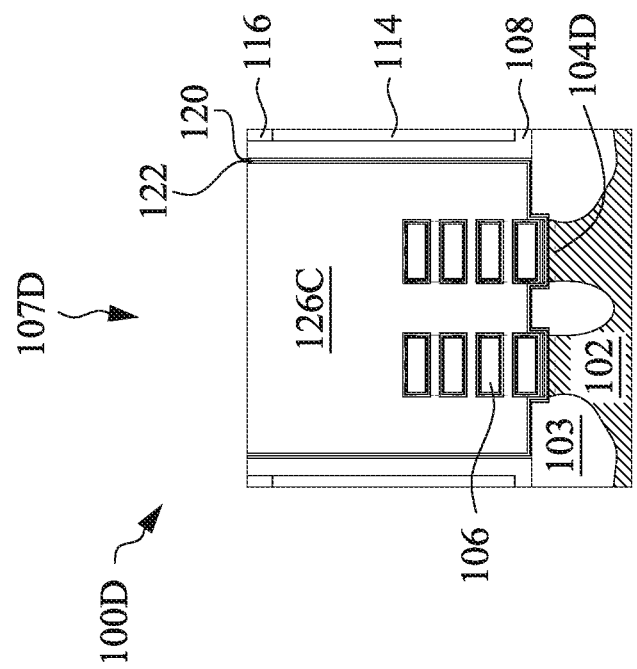

FIGS. 5A and 5B show two cross-sectional views of a PFET core device, according to aspects of the present disclosure.

Figure 6A:
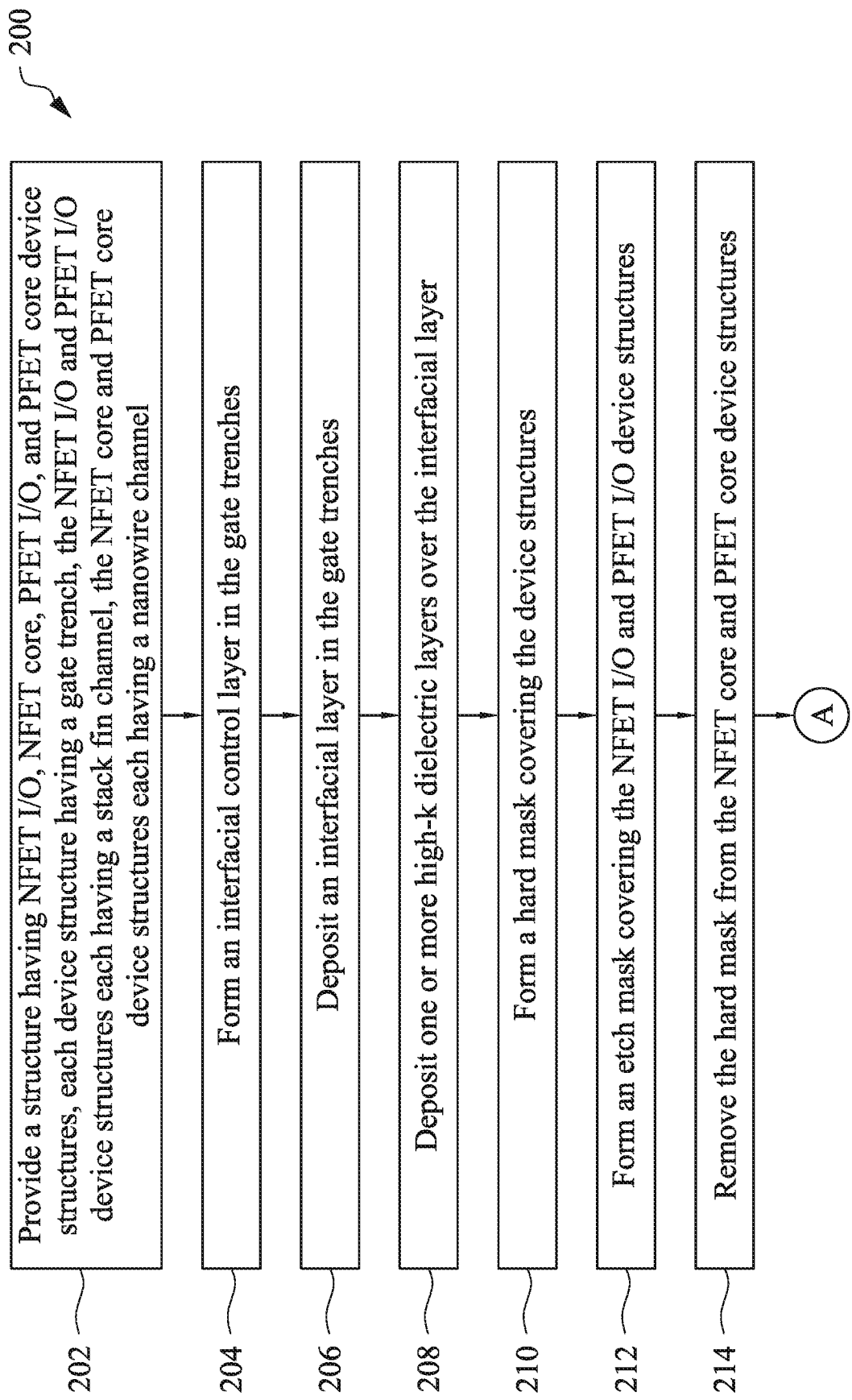
Figure 6B:
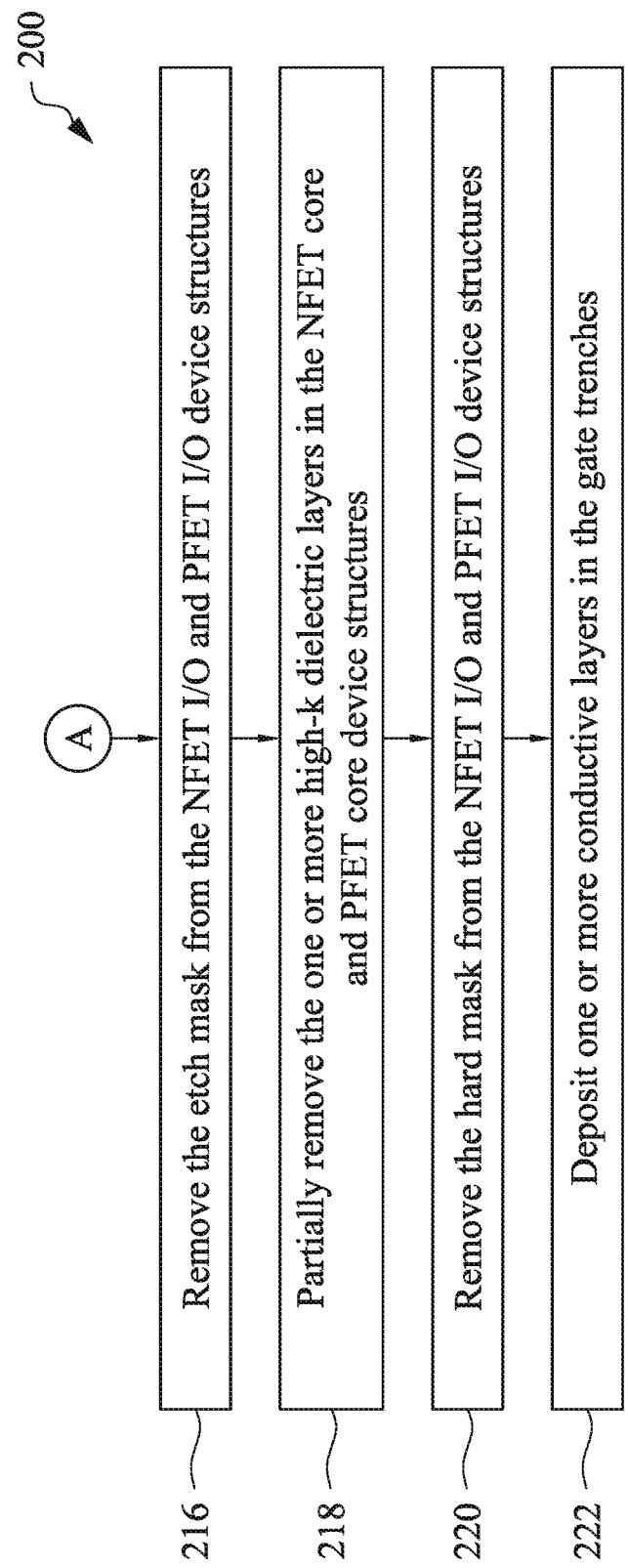

FIGS. 6A and 6B show a flow chart of a method for forming the devices shown in FIGS. 2A-5B, according to aspects of the present disclosure.

Figure 7A:
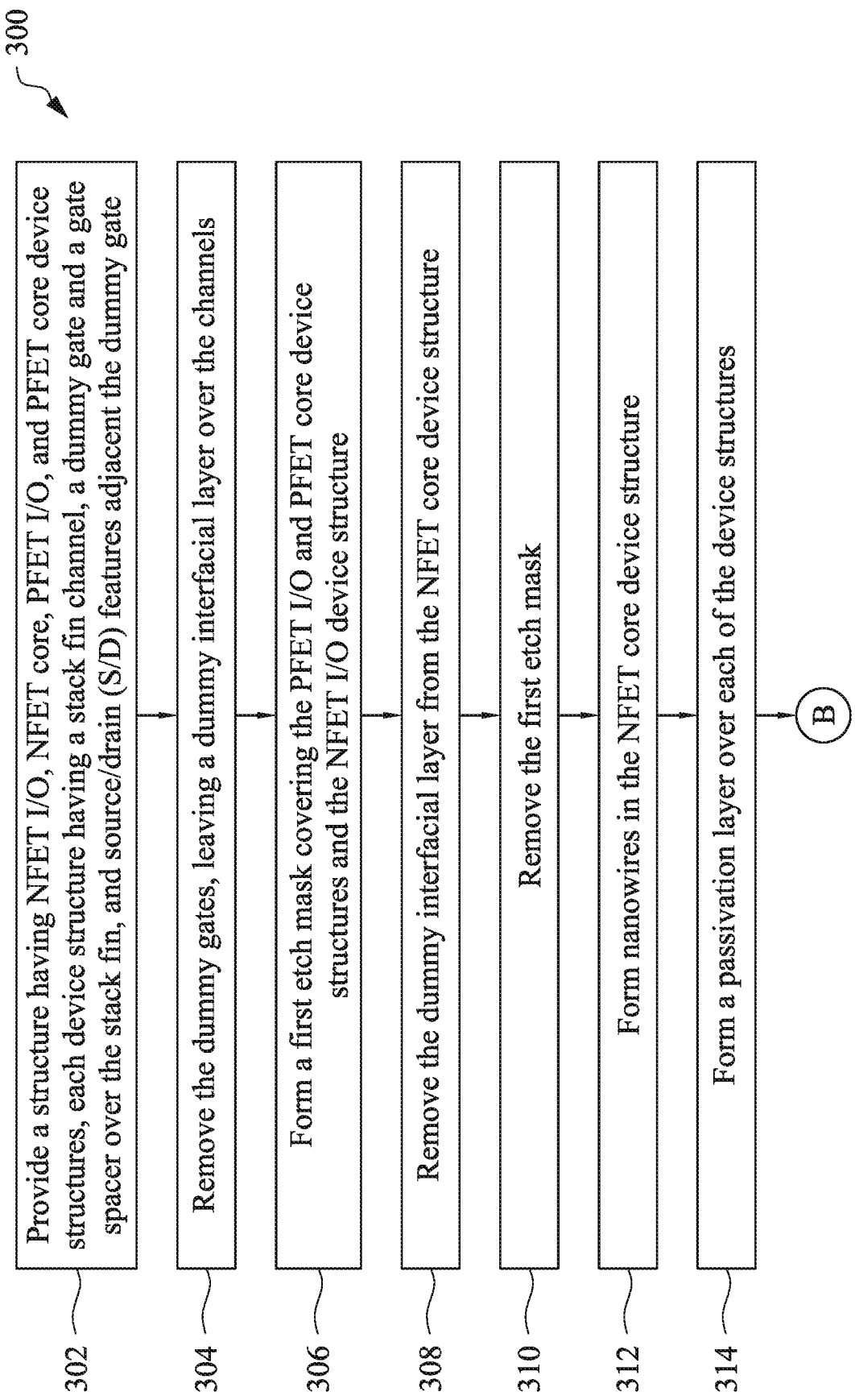
Figure 7B:
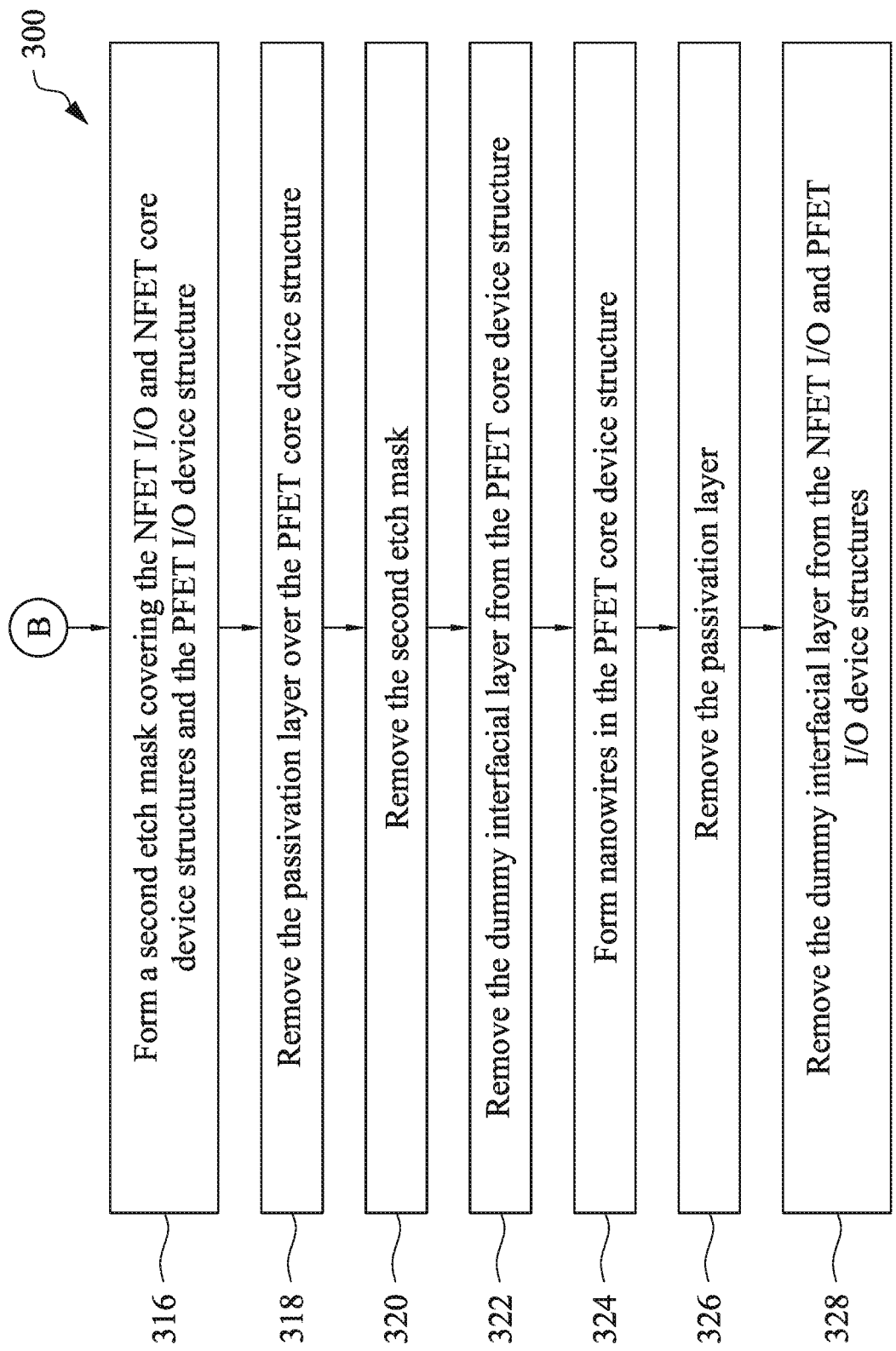

FIGS. 7A and 7B show a flow chart of a method for preparing a structure to be processed by the method of FIGS. 6A-B, according to aspects of the present disclosure.

FIGS. 8A, 8B, 9A, 9B, 10, 11, 12, 13, 14, 15, 16, 17A, and 17B illustrate cross-sectional views of a semiconductor structure during fabrication processes according to the method of FIGS. 7A-B, in accordance with an embodiment.

FIGS. 18, 19, 20, 21, 22, 23, 24, 25, and 26 illustrate cross-sectional views of an NFET core device, an NFET I/O device, a PFET core device, and a PFET I/O device during fabrication processes according to the method of FIGS. 7A-B, in accordance with an embodiment.

FIGS. 27, 28, 29, 30, 31, 32, 33, 34, and 35 illustrate cross-sectional views of an NFET core device, an NFET I/O device, a PFET core device, and a PFET I/O device during fabrication processes according to the method of FIGS. 6A-B, in accordance with an embodiment.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to integrate circuits (IC) having I/O devices (or transistors) with a stack fin channel and core devices (or transistors) with a nanowire channel. An object of the present disclosure is to form gate stacks for the I/O devices and core devices with a low thermal process. This provides better S/D junction control for the IC. A further object of the present disclosure is to form the same interfacial layer in the I/O gate stacks and the core gate stacks and to tune one or more high-k dielectric layers above the interfacial layer in order to achieve different TDDB (gate dielectric breakdown) voltages in the two gate stacks. This provides performance gain by increasing CET (capacitance equivalent oxide thickness) scaling window. These and other benefits will become evident after the discussion of various embodiments of the present disclosure as exemplified in FIGS. 1-35.

Referring to FIG. 1, shown therein are a gate stack (or gate structure) 10A for I/O devices and another gate stack (or gate structure) 10B for core devices, constructed according to embodiments of the present disclosure. An I/O device provides input/output functions at the boundary of an IC, and a core device provides functionality within the IC (e.g., between core devices or between a core device and an I/O device). In an example, the gate stacks 10A and 10B may be implemented in advanced process nodes, such as 2 nm processes. For example, the I/O gate stack 10A, in an embodiment, may provide a breakdown voltage ($V_{BD}$) of 3.0V at a supply voltage ($V_{dd}$) of 1.0V, an n/p-TDDB (NFET TDDB and PFET TDDB) of 1.1V, and a CET of 21 angstroms (Å). The core gate stack 10B provides a lower $V_{BD}$, a lower n/p-TDDB, and a thinner CET than the I/O gate stack 10A.

The I/O gate stack 10A includes an interfacial layer 12, a high-k dielectric stack 14A directly above the interfacial layer 12, and a conductive layer 16 directly above and in physical contact with the high-k dielectric stack 14A. The interfacial layer 12 may include silicon dioxide f($SiO_2$), alumina ($Al_2O_3$), aluminum silicon oxide (AlSiO), silicon oxynitride (SiON), or other suitable materials. Particularly, the interfacial layer 12 has a thickness of 8 to 12 Å in the present embodiment which is much thinner than traditional I/O gate oxide thickness such as 30 to 40 Å. Having the thin interfacial layer 12 obviates the high-temperature post oxidation anneal (POA) process typically used for forming thick gate oxide in traditional I/O gate stacks. The high-k dielectric stack 14A includes one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The conductive layer 16 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), or combinations thereof. The metal fill layer may include aluminum (Al), tungsten (W), cobalt (Co), copper (Cu), and/or other suitable materials.

The core gate stack 10B includes the interfacial layer 12, a high-k dielectric stack 14B directly above the interfacial layer 12, and the conductive layer 16 directly above and in physical contact with the high-k dielectric stack 14B. The high-k dielectric stack 14B includes one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof.

In the present embodiment, the high-k dielectric stack 14A includes the same material layers as the high-k dielectric stack 14B plus one or more additional high-k dielectric layers 15. In one example, the high-k dielectric stack 14B includes a layer of $HfO_2$ of 10 to 20 Å, and the high-k dielectric stack 14A includes the same layer(s) as the high-k dielectric stack 14B and further includes a layer (the layer 15) of $Al_2O_3$ of 5 to 20 Å. This simplifies the process flow of forming the I/O gate stack 10A and the core gate stack 10B in the same IC, as will be demonstrated later. In another example, the high-k dielectric stack 14B includes a layer of $HfO_2$ over a layer of HfSiO, and the high-k dielectric stack 14A includes the same layers as the high-k dielectric stack 14B and further includes a layer (the layer 15) of $Al_2O_3$.

In another embodiment, the high-k dielectric stacks 14A and 14B include the same material layers, but the high-k dielectric stack 14A is thicker than the high-k dielectric stack 14B, for example, by 5 to 20 Å. For example, both the high-k dielectric stacks 14A and 14B may include a layer of $HfO_2$, but the layer of $HfO_2$ in the high-k dielectric stack 14A is thicker than the layer of $HfO_2$ in the high-k dielectric stack 14B by 5 to 20 Å. The difference in the thickness of the high-k dielectric stacks 14A and 14B can be tuned by selectively etching the high-k dielectric stack 14B.

Figure 2B:
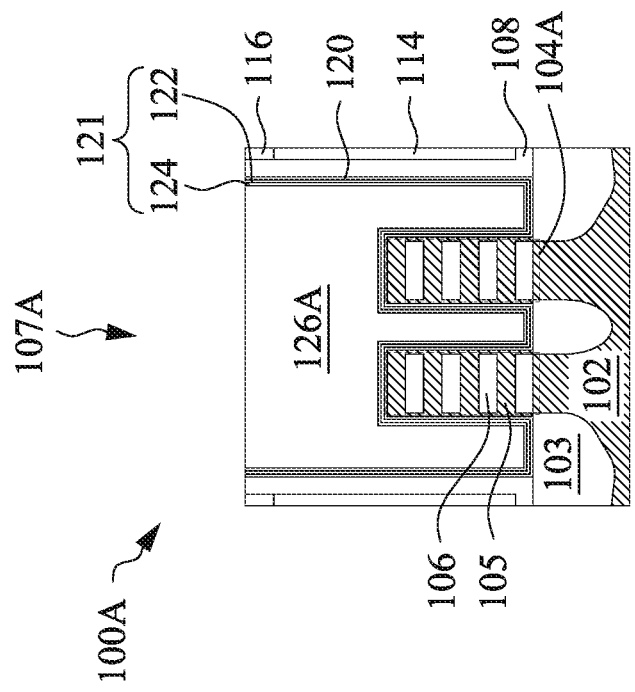
FIGS. 2A and 2B show two cross-sectional views of an NFET (n-type field effect transistor) I/O device, according to aspects of the present disclosure.
Figure 2A:
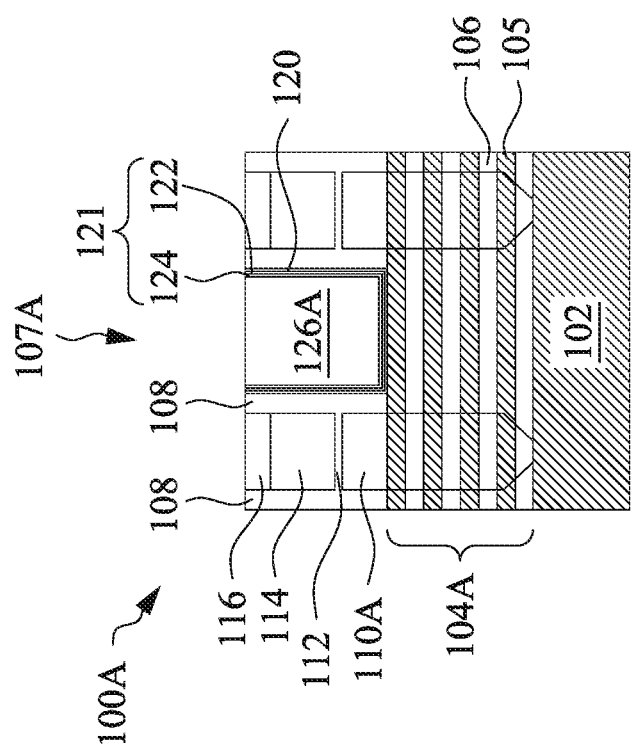

FIGS. 2A-5B illustrate exemplary semiconductor devices that implement the gate stacks 10A and/or 10B. FIG. 2A shows a cross-sectional view of an NFET I/O device 100A, cut along the length of the FET channel or the length of the fin in a FinFET (such view is referred to as "X-cut" hereinafter). FIG. 2B shows a cross-sectional view of the NFET I/O device 100A, cut along the width of the FET channel or the width of the fin in a FinFET (such view is referred to as "Y-cut" herein after). FIGS. 3A and 3B show an NFET core device 100B in X-cut and Y-cut, respectively. FIGS. 4A and 4B show a PFET I/O device 100C in X-cut and Y-cut, respectively. FIGS. 5A and 5B show a PFET core device 100D in X-cut and Y-cut, respectively.

Referring to FIGS. 2A and 2B, the device 100A includes a substrate 102 and a stack fin 104A over the substrate 102. The stack fin 104A includes multiple layers 105 of a first semiconductor material and multiple layers 106 of a second semiconductor material alternately stacked (hence the term "stack fin"). The device 100A further includes an isolation structure 103 that isolates multiple stack fins 104A (two shown in FIG. 2B).

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In the present embodiment, the devices 100A, 100B, 100C, and 100D are built upon the same substrate 102.

The isolation structure 103 may comprise silicon oxide, silicon nitride, silicon oxynitride, fluoride-doped silicate glass (FSG), a low-k dielectric material, and/or other suitable insulating material. The isolation structure 103 may be shallow trench isolation (STI) features. Other isolation structure such as field oxide, LOCal Oxidation of Silicon (LOCOS), and/or other suitable structures are possible. The isolation structure 103 may include a multi-layer structure, for example, having one or more thermal oxide liner layers.

The first semiconductor material (in the layers 105) is different from the second semiconductor material (in the layers 106), in material and/or composition. Each of the first semiconductor material and the second semiconductor material may include silicon, germanium, a compound semiconductor including silicon carbide, gallium arsenic, gallium phosphide, indium phosphide, indium arsenide, and indium antimonide, or an alloy semiconductor including SiGe, GaAsP, AlInAs, AlGaAs, GaInAs, GaInP, and GaInAsP. In the present embodiment, the layers 105 comprise silicon, and the layers 106 comprise germanium or silicon germanium alloy. The layers 105 and 106 in the stack fin 104A may additionally include dopants for improving the performance of the NFET I/O device 100A. For example, the layer 105 may include n-type dopant(s) such as phosphorus or arsenic, and the layer 106 may include p-type dopant(s) such as boron or indium.

The device 100A further includes a gate stack (or gate structure) 107A and gate spacers 108 on the sidewalls of the gate stack 107A. The gate stack 107A engages the stack fin 104A in the channel region of the device, for example, on top and sidewalls of the stack fin 104A as shown in FIG. 2B. The gate stack 107A includes an interfacial layer 120, a high-k dielectric stack 121 including high-k dielectric layers 122 and 124, and a conductive layer 126A. In an embodiment, the interfacial layer 120, the high-k dielectric stack 121, and the conductive layer 126A may use the same materials as the interfacial layer 12, the high-k dielectric stack 14A, and the conductive layer 16 of FIG. 1, respectively. For example, the interfacial layer 120 may comprise silicon dioxide (SiO2) having a thickness of 8 to 12 Å, the high-k dielectric layer 122 may comprise hafnium oxide (HfO$_2$) having a thickness of 10 to 20 Å, the high-k dielectric layer 124 may comprise alumina (Al$_2$O$_3$) having a thickness of 5 to 20 Å, and the conductive layer 126A may comprise one or more n-type work function metal layers and a metal fill layer. Each of the high-k dielectric layers 122 and 124 may comprise one or more layers of materials. In the present embodiment, the interfacial layer 120 and the high-k dielectric stack 121 are formed as conformal layers on top and sidewalls of the stack fin 104A and on sidewalls of the gate spacers 108.

The device 100A further includes S/D features 110A partially embedded in the stack fin 104A and adjacent to the gate spacers 108, and dielectric layers 112, 114, and 116 over the S/D features 110A and between the gate spacers 108.

The gate spacers 108 comprise a dielectric material, such as silicon oxide, silicon nitride, silicon oxynitride, silicon carbide, other dielectric material, or combinations thereof. The S/D features 110A may comprise n-type doped silicon in an embodiment, such as n-type doped epitaxially grown silicon. The dielectric layer 112 may comprise silicon nitride, silicon oxynitride, silicon nitride with oxygen (O) or carbon (C) elements, and/or other materials. The dielectric layer 114 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 116 may comprise a nitride such as silicon nitride for protecting the dielectric layer 114 during various etching processes, which will be explained later.

Referring to FIGS. 3A and 3B, shown therein are cross-sectional views of the NFET core device 100B. Many aspects of the device 100B are the same as or similar to those of the device 100A. For example, the device 100B in the present embodiment also includes the substrate 102, the isolation structure 103, the gate spacers 108, the S/D features 110A, and the dielectric layers 112, 114, and 116. Different from the device 100A, the device 100B includes a nanowire channel 104B. In the present embodiment, the nanowire channel 104B includes nanowires of the first semiconductor material (produced from the layers 105), while the layers 106 are removed from the channel region of the device 100B. It is noted that, in the S/D regions of the device 100B, the layers 105 and 106 are still alternately stacked. Another difference between the devices 100A and 100B is that the device 100B includes a gate stack 107B that is designed for the core device 100B. The gate stack 107B includes the interfacial layer 120, the high-k dielectric layer 122 (which may comprise one or more layers of high-k dielectric materials), and the conductive layer 126A. In an embodiment, the interfacial layer 120, the high-k dielectric layer 122, and the conductive layer 126A may use the same materials as the interfacial layer 12, the high-k dielectric stack 14B, and the conductive layer 16 of FIG. 1, respectively. The gate stack 107B has a thinner high-k dielectric stack or fewer high-k dielectric layers between the interfacial layer 120 and the conductive layer 126A than the gate stack 107A (FIGS. 2A-B). The gate stack 107B engages the nanowire channel 104B, for example, by wrapping around the nanowires of the nanowire channel 104B as shown in FIG. 3B. One reason that the channel 104A (FIGS. 2A-B) has a stack fin rather than nanowires (such as the channel 104B) in the present embodiment is that the device 100A may have a relatively thicker dielectric stack (including the interfacial layer 120 and the high-k dielectric layers 122 and 124) that otherwise might be too thick to fit into the space between adjacent nanowires.

Referring to FIGS. 4A and 4B, shown therein are cross-sectional views of the PFET I/O device 100C. Many aspects of the device 100C are the same as or similar to those of the device 100A. For example, the device 100C also includes the substrate 102, the isolation structure 103, the gate spacers 108, and the dielectric layers 112, 114, and 116. The device 100C includes a stack fin 104C having the layers 105 and 106 alternately stacked. The layers 105 and 106 in the stack fin 104C may additionally include dopants for improving the performance of the PFET I/O device 100C. The device 100C includes a gate stack 107C that includes the interfacial layer 120, the high-k dielectric stack 121, and a conductive layer 126C, which may use the same materials as the interfacial layer 12, the high-k dielectric stack 14A, and the conductive layer 16 of FIG. 1, respectively. Different from the conductive layer 126A, the conductive layer 126C is designed for the PFET device 100C, for example, by including one or more p-type work function metal layers. The device 100C further includes S/D features 110C that are designed for the PFET device 100C, for example, by including p-type doped silicon germanium such as p-type doped epitaxially grown silicon germanium.

Referring to FIGS. 5A and 5B, shown therein are cross-sectional views of the PFET core device 100D. Many aspects of the device 100D are the same as or similar to those of the device 100C. For example, the device 100D also includes the substrate 102, the isolation structure 103, the gate spacers 108, the S/D features 110C, and the dielectric layers 112, 114, and 116. Different from the device 100C, the device 100D includes a nanowire channel 104D. In the present embodiment, the nanowire channel 104D includes nanowires of the second semiconductor material (produced from the layers 106), while the layers 105 are removed from the channel region of the device 100D. It is noted that, in the S/D regions of the device 100D, the layers 105 and 106 are still alternately stacked. Another difference between the devices 100C and 100D is that the device 100D includes a gate stack 107D that is designed for the core device 100D.

The gate stack 107D includes the interfacial layer 120, the high-k dielectric layer 122 (which may comprise one or more layers of high-k dielectric materials), and the conductive layer 126C. In an embodiment, the interfacial layer 120, the high-k dielectric layer 122, and the conductive layer 126C may use the same materials as the interfacial layer 12, the high-k dielectric stack 14B, and the conductive layer 16 of FIG. 1, respectively. The gate stack 107D has a thinner high-k dielectric stack or fewer high-k dielectric layers between the interfacial layer 120 and the conductive layer 126C than the gate stack 107C. The gate stack 107D engages the nanowire channel 104D, for example, by wrapping around the nanowires of the nanowire channel 104D as shown in FIG. 5B. One reason that the channel 104C (FIGS. 4A-B) has a stack fin rather than nanowires (such as the channel 104D) in the present embodiment is that the device 100C may have a relatively thicker dielectric stack (including the interfacial layer 120 and the high-k dielectric layers 122 and 124) that otherwise might be too thick to fit into the space between adjacent nanowires.

FIGS. 6A-B illustrate a flow chart of a method 200 for forming the devices 100A, 100B, 100C, and 100D in the same IC. FIGS. 7A-B illustrate a flow chart of a method 300 for providing an initial structure for the method 200. The methods 200 and 300 are merely examples, and are not intended to limit the present disclosure beyond what is explicitly recited in the claims. Additional operations can be provided before, during, and after each of the methods 200 and 300, and some operations described can be replaced, eliminated, or moved around for additional embodiments of the methods. The methods 200 and 300 are described below in conjunction with FIGS. 8A-35.

Figure 25:
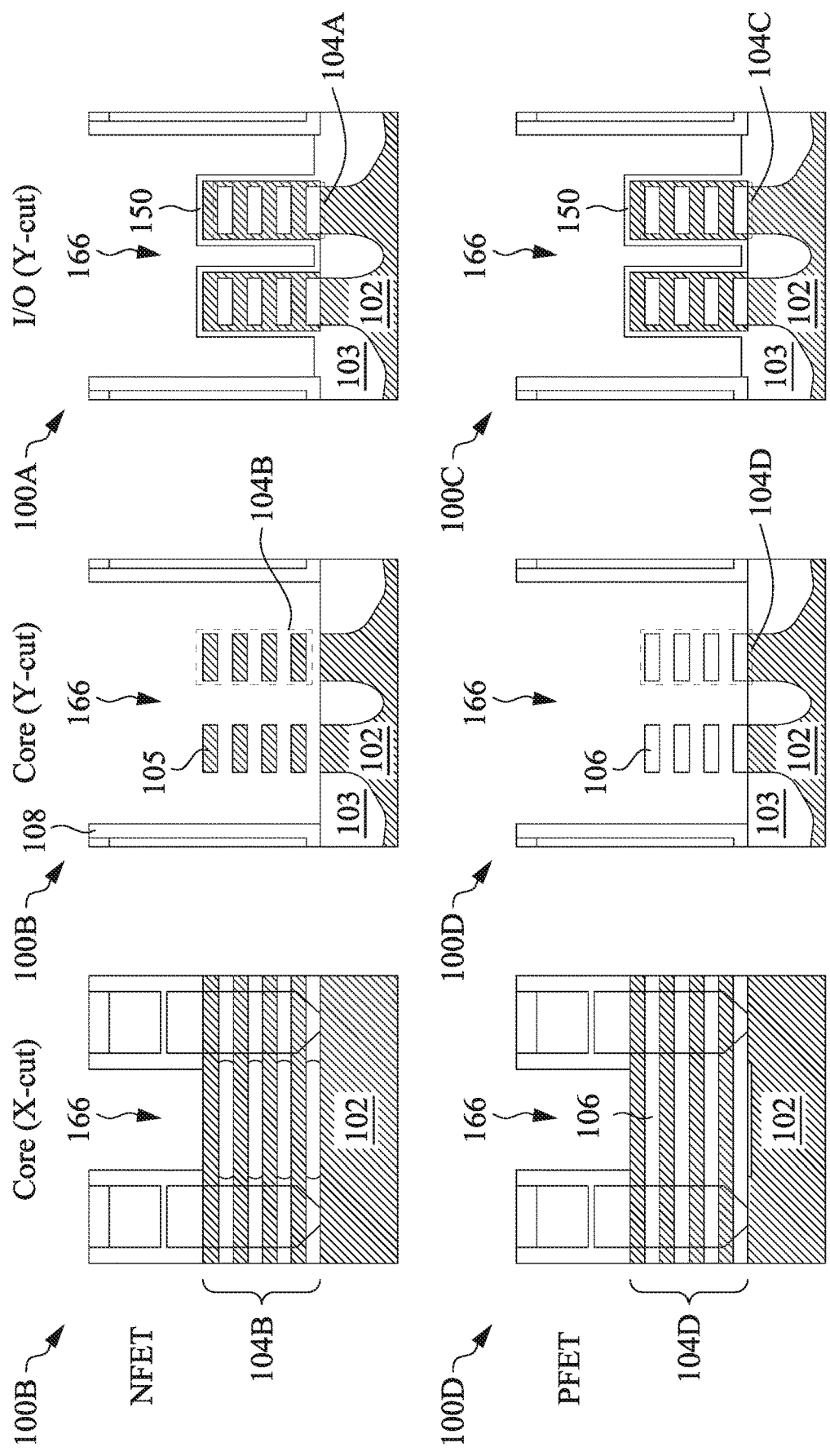
Figure 26:
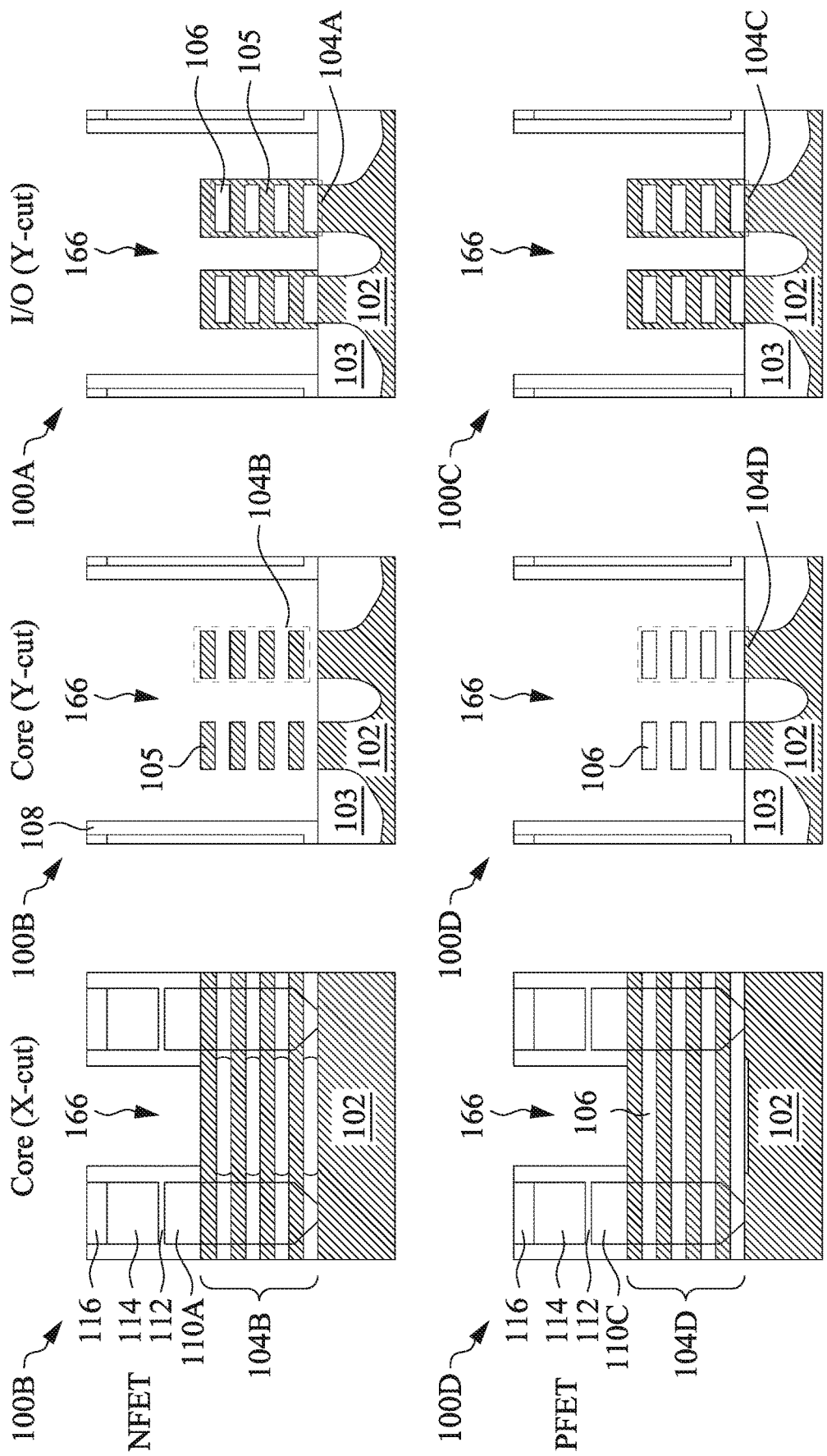

At operation 202, the method 200 (FIG. 6A) provides a structure (or device structure) that includes an NFET I/O device structure 100A, an NFET core device structure 100B, a PFET I/O device structure 100C, and a PFET core device structure 100D, as shown in FIG. 26. Referring to FIG. 26, for the purposes of simplicity, the four device structures are displayed in two rows and three columns. The top row shows cross-sectional views of the NFET device structures 100A and 100B, and the bottom row shows cross-sectional views of the PFET device structures 100C and 100D. The leftmost column shows the NFET core device structure 100B and the PFET core device structure 100D in an X-cut view. The middle column shows the NFET core device structure 100B and the PFET core device structure 100D in a Y-cut view. The rightmost column shows the NFET I/O device structure 100A and the PFET I/O device structure 100C in a Y-cut view. The X-cut views of the device structures 100A and 100C are not provided in FIG. 26 (and in FIGS. 18-25 and 27-35), but persons having ordinary skill in the art can derive those views, for example, from FIGS. 2A and 4A.

Still referring to FIG. 26, each of the device structures 100A, 100B, 100C, and 100D includes the substrate 102, the isolation structure 103, the gate spacers 108, and the dielectric layers 112, 114, and 116. Each of the four device structures further includes a gate trench 166 having the gate spacers 108 as the sidewalls and exposing the channel region of the respective device structures. The I/O device structures 100A and 100C include stack fin channels 104A and 104C, respectively, and each of the stack fin channels 104A and 104C has the layers 105 and 106 alternately stacked. The NFET core device structure 100B includes a nanowire channel 104B having nanowires 105. The PFET core device structure 100D includes a nanowire channel 104D having nanowires 106. In the present embodiment, the features 105 include silicon, such as silicon in crystalline structure, and may be doped with n-type dopant(s) such as phosphorus or arsenic. Further, the features 106 include germanium, such as germanium in crystalline structure, or silicon germanium alloy, and may be doped with p-type dopant(s) such as boron or indium. The outer surfaces of the stack fin channels 104A and 104C and the nanowire channels 104B and 104D are exposed in the respective gate trenches 166. The NFET device structures 100A and 100B include the n-type S/D features 110A, while the PFET device structures 100C and 100D include the p-type S/D features 110C.

Forming the device structures shown in FIG. 26 from an initial substrate involves a variety of processes, an embodiment of which is illustrated in FIGS. 7A and 7B in conjunction with FIGS. 8A-25.

Referring to FIG. 7A, at operation 302, the method 300 provides a structure having an NFET I/O device structure, an NFET core device structure, a PFET I/O device structure, and a PFET core device structure. Each of the device structures includes a stack fin channel, a dummy gate engaging the stack fin channel, gate spacers on sidewalls of the dummy gate, and S/D features adjacent to the gate spacers. The operation 302 also involves a variety of processes, as shown in FIGS. 8A-16.

Referring to FIGS. 8A (X-cut) and 8B (Y-cut), a device structure 100 is presented, which can be any of the NFET I/O device structure 100A, the NFET core device structure 100B, the PFET I/O device structure 100C, and the PFET core device structure 100D. The device structure 100 includes the substrate 102, stack fins 104 (two shown) over the substrate 102, and the isolation structure 103 laterally isolating the fins 104. The stack fins 104 have the layers 105 and 106 alternately stacked. The stack fins 104 can be formed by epitaxially growing the layers 105 and 106 over the entire area of the substrate 102 and then patterned to form the individual fins 104. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104 by etching the initial layers 105 and 106. The etching process can include dry etching, wet etching, reactive ion etching (RIE), and/or other suitable processes.

Figure 9B:
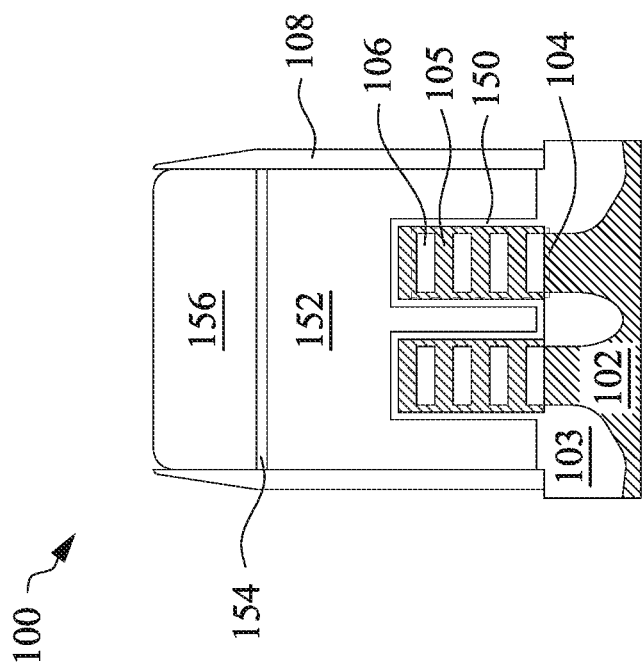
Figure 9A:
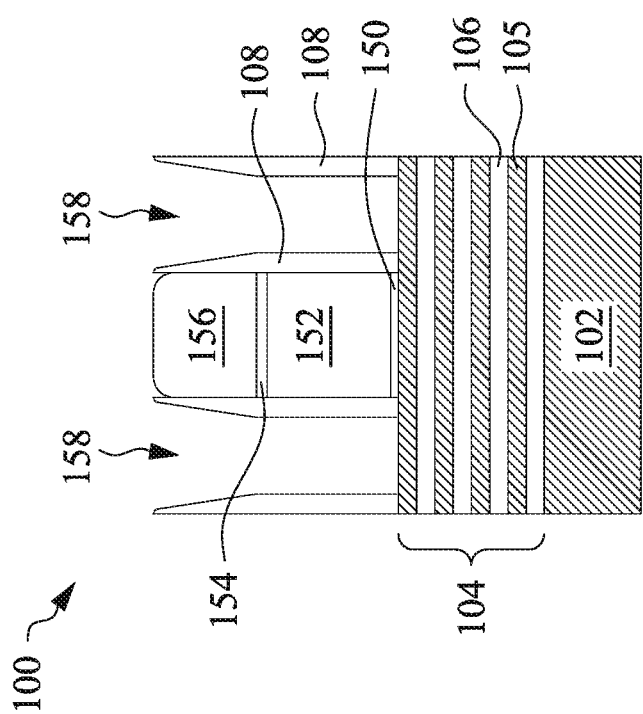

Referring to FIGS. 9A (X-cut) and 9B (Y-cut), the operation 302 further forms a dummy interfacial layer 150, a dummy gate electrode 152, a first hard mask layer 154, and a second hard mask layer 156, sequentially stacked over the fins 104. The operations 302 further forms the gate spacers 108 over the sidewalls of the layers 150, 152, 154, and 156. The dummy interfacial layer 150 may include a dielectric material such as silicon oxide layer (e.g., $SiO_2$) or silicon oxynitride (e.g., SiON), and may be formed by chemical oxidation, thermal oxidation, atomic layer deposition (ALD), chemical vapor deposition (CVD), and/or other suitable methods. The dummy gate electrode 152 may include poly-crystalline silicon (poly-Si) and may be formed by suitable deposition processes such as low-pressure chemical vapor deposition (LPCVD) and plasma-enhanced CVD (PECVD). Each of the hard mask layers 154 and 156 may include one or more layers of dielectric material such as silicon oxide and/or silicon nitride, and may be formed by CVD or other suitable methods. The various layers 150, 152, 154, and 156 may be patterned by photolithography and etching processes. The gate spacers 108 may comprise a dielectric material, such as silicon oxide, silicon nitride, silicon oxynitride, silicon carbide, other dielectric material, or combinations thereof, and may comprise one or multiple layers of material. The gate spacers 108 may be formed by depositing a spacer material as a blanket over the isolation structure 103, the fins 104, and the dummy gate stack 150/152/154/156. Then the spacer material is etched by an anisotropic etching process to expose the isolation structure 103, the hard mask layer 156, and a top surface of the fins 104. Portions of the spacer material on the sidewalls of the dummy gate stack 150/152/154/156 become the gate spacers 108. Adjacent gate spacers 108 provide trenches 158 that expose the fins 104 in the S/D regions of the device.

Referring to FIG. 10 (X-cut), the operation 302 forms S/D features 110 in the S/D regions. For example, the operations 302 may etch recesses into the fins 104 exposed in the trenches 158, and epitaxially grow semiconductor materials in the recesses. The semiconductor materials may be raised above the top surface of the fins 104, as illustrated in FIG. 10. The operations 302 may form the S/D features 110 separately for NFET and PFET devices. For example, the operations 302 may form the S/D features 110 with an n-type doped silicon for NFET devices (e.g., 110A of FIGS. 2A, 3A, and 26), and with a p-type doped silicon germanium for PFET devices (e.g., 110C of FIGS. 4A, 5A, and 26).

Referring to FIG. 11 (X-cut), the operation 302 forms the dielectric layers 112 and 114. The dielectric layer 112 may comprise silicon nitride, silicon oxynitride, silicon nitride with oxygen (O) or carbon (C) elements, and/or other materials; and may be formed by CVD, PVD (physical vapor deposition), ALD, or other suitable methods. The dielectric layer 114 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 114 may be formed by PECVD or FCVD (flowable CVD), or other suitable methods.

Figure 13:
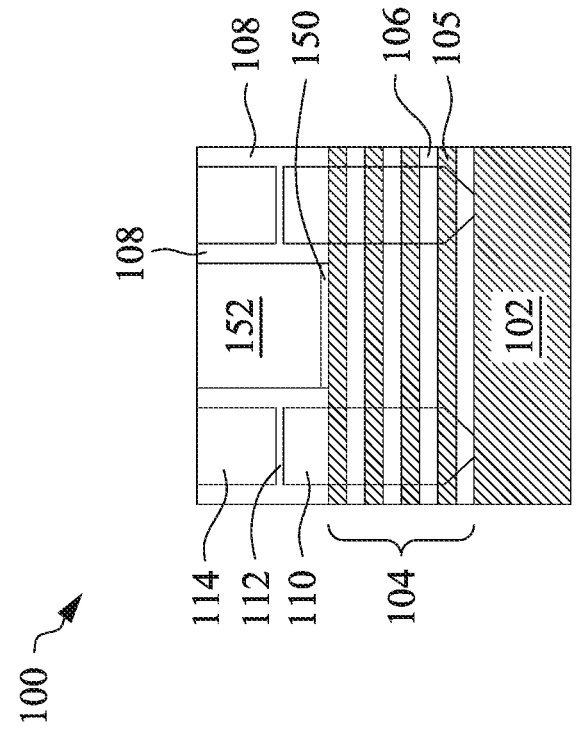
Figure 12:
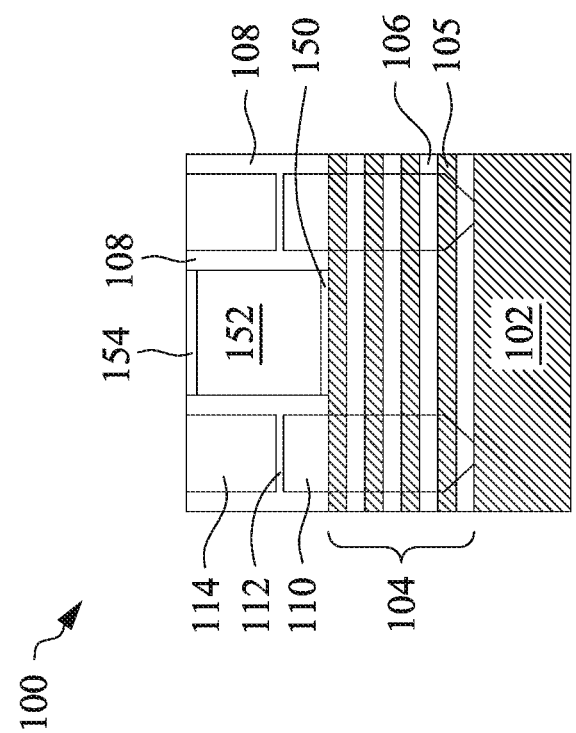
Figure 15:
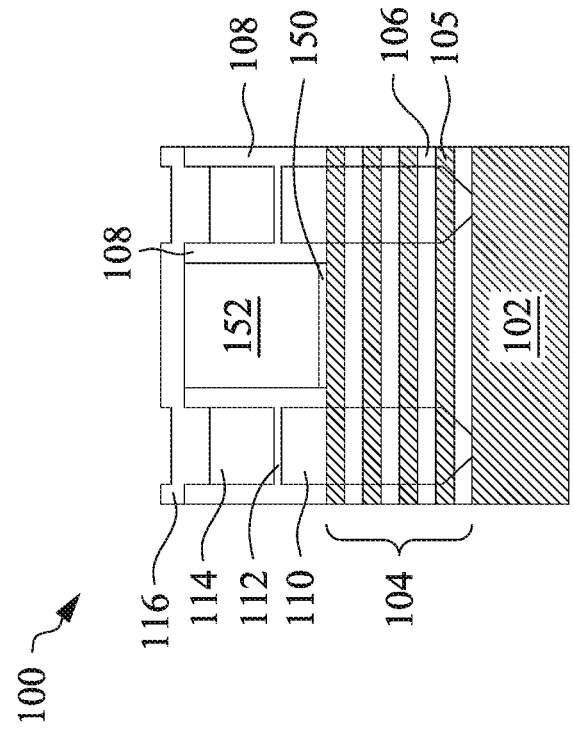
Figure 14:
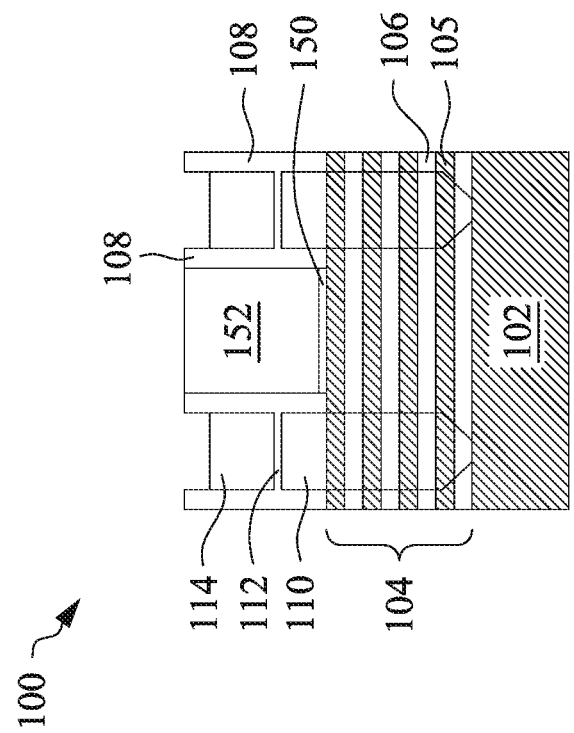
Figure 16:
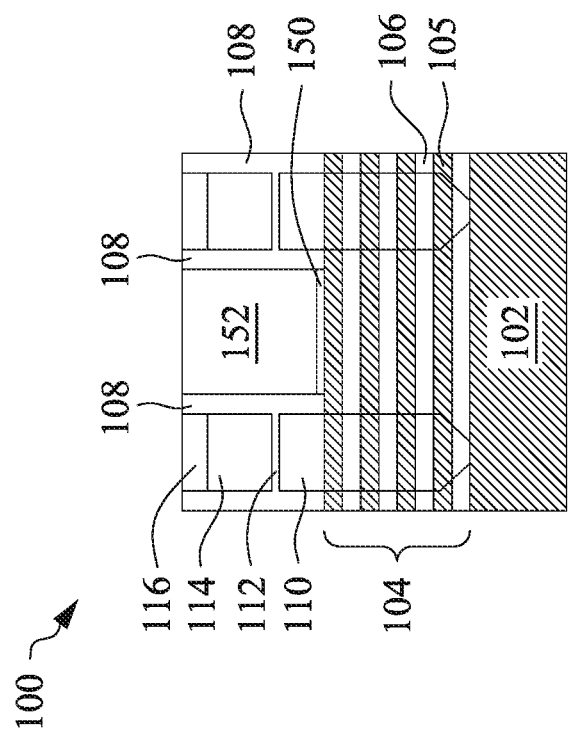

Referring to FIG. 12 (X-cut), the operation 302 performs an etching back process or a CMP (chemical mechanical polishing) process to remove the hard mask layer 156 and expose the hard mask layer 154. Referring to FIG. 13 (X-cut), the operation 302 performs a buffing CMP process to remove the hard mask layer 154 and expose the dummy gate electrode 152. Referring to FIG. 14 (X-cut), the operation 302 performs an etching back process to the dielectric layer 114 to recess it below the top surface of the gate spacers 108. Referring to FIG. 15 (X-cut), the operation 302 deposits a dielectric layer 116, which may comprise a nitride such as silicon nitride for protecting the dielectric layer 114 during subsequent etching processes. Referring to FIG. 16 (X-cut), the operation 302 performs a CMP process to planarize the top surface of the device structure 100.

Figure 17A:
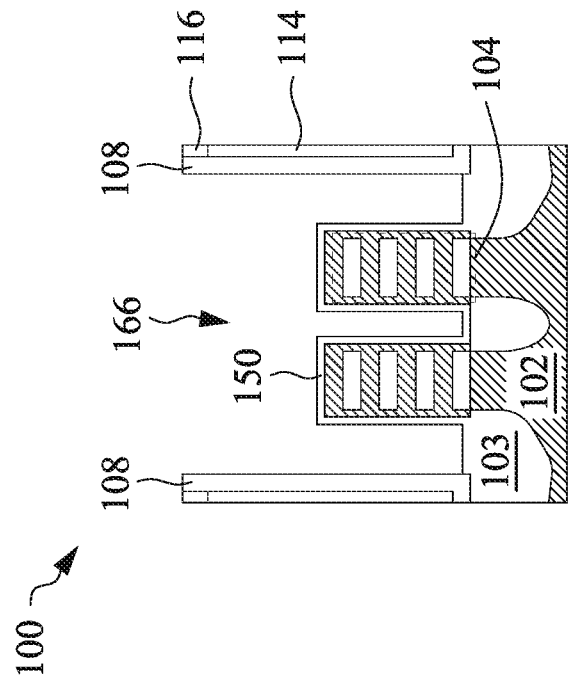
Figure 17B:
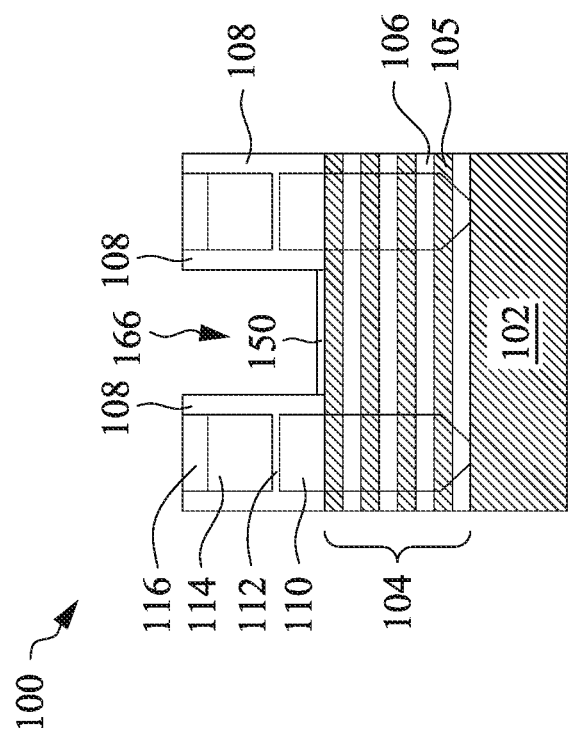

At operation 304, the method 300 (FIG. 7A) removes the dummy gate electrode 152, resulting in a gate trench 166 (FIGS. 17A-B). The operation 304 may include one or more etching processes that are selective to the material in the dummy gate electrode 152. The resultant structure 100 is shown in FIG. 17A (X-cut) and FIG. 17B (Y-cut), wherein the dummy interfacial layer 150 is exposed in the gate trench 166.

Figure 18:
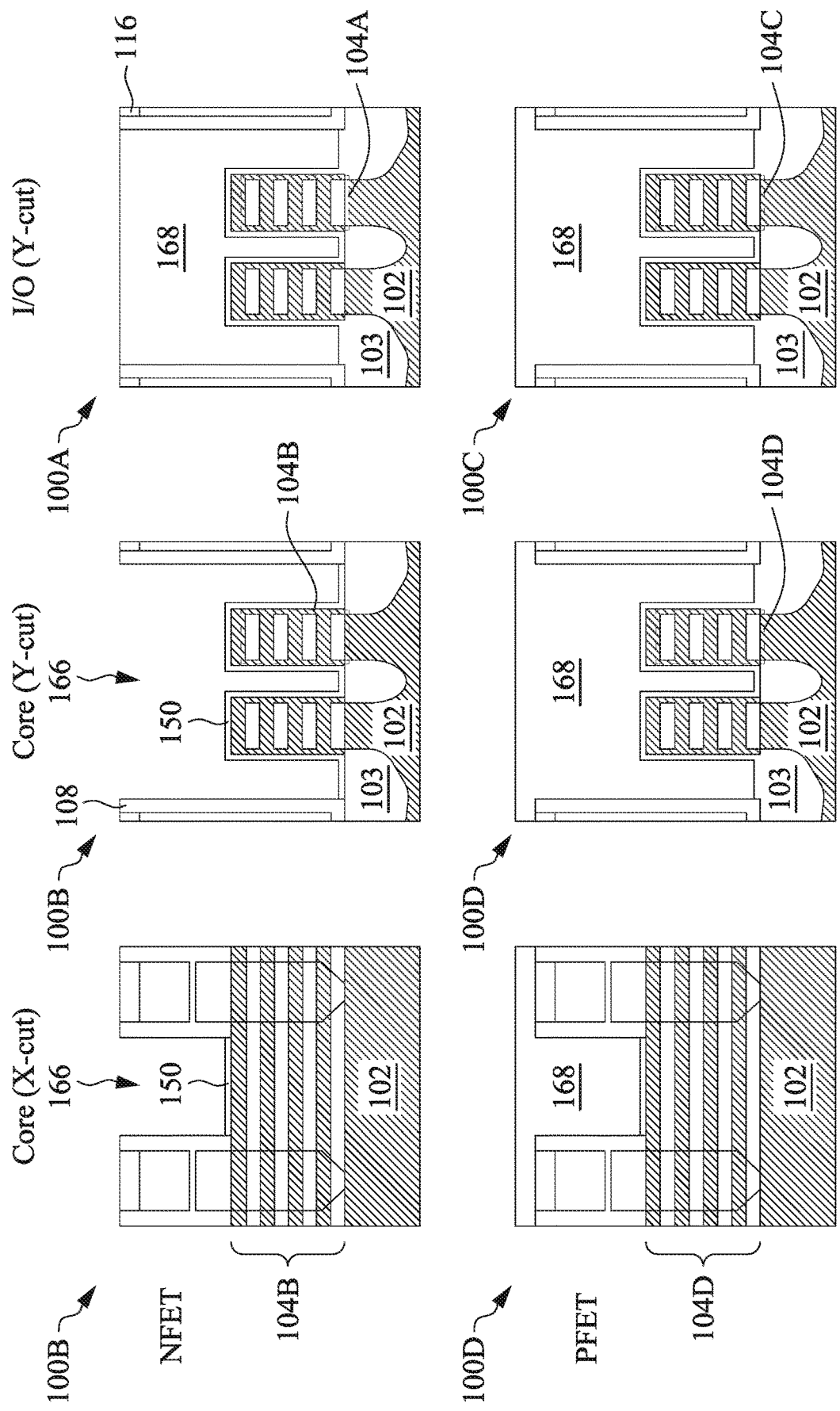

At operation 306, the method 300 (FIG. 7A) forms an etch mask 168 that covers the NFET I/O device structure 100A, the PFET I/O device structure 100C, and the PFET core device structure 100D as illustrated in FIG. 18. As discussed above, the device structures 100A, 100B, 100C, and 100D at this fabrication stage can be prepared by the operations 302 and 304 as illustrated in FIGS. 8A-17B, where the device structure 100 can be any of the device structures 100A, 100B, 100C, and 100D. The etch mask 168 may be a patterned photoresist formed by photoresist coating, exposing, post-exposure baking, and developing in one example. The NFET core device structure 100B is exposed through the etch mask 168.

At operation 308, the method 300 (FIG. 7A) removes the dummy interfacial layer 150 from the NFET core device structure 100B, for example, by wet etching, dry etching, reactive ion etching, or other suitable etching methods. For example, the operation 308 may apply HF-based wet etchant(s) for wet etching or $NH_3$ and $H_2$ mixture for dry etching. During this operation, the etch mask 168 covers the NFET I/O device structure 100A, the PFET I/O device structure 100C, and the PFET core device structure 100D.

Figure 19:
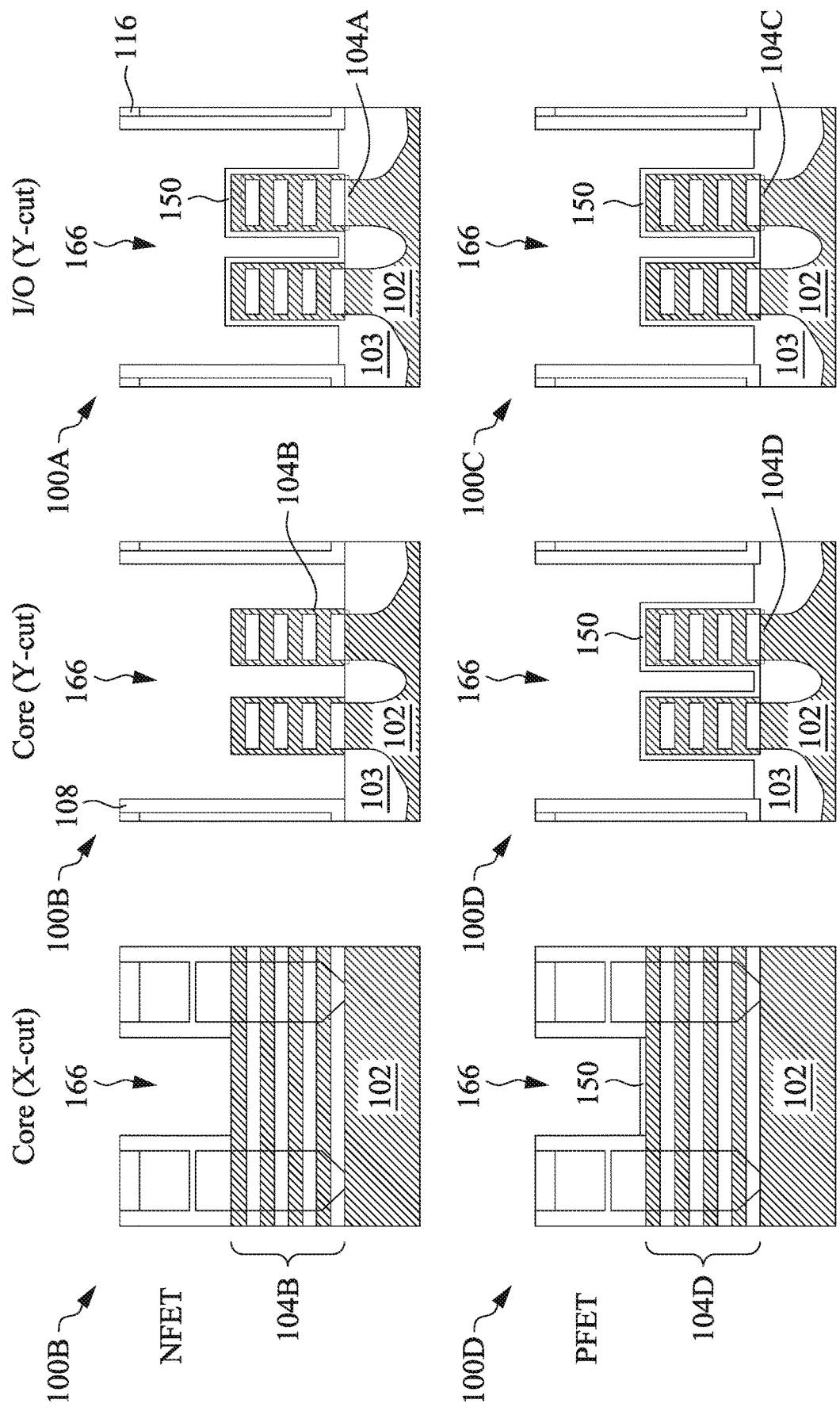

At operation 310, the method 300 (FIG. 7A) removes the etch mask 168, for example, by ashing or stripping. The resultant device structures are shown in FIG. 19. Referring to FIG. 19, the stack fin 104B is exposed in the gate trench 166 in the NFET core device structure 100B, and the dummy interfacial layer 150 is exposed in the gate trenches 166 in the other device structures 100A, 100C, and 100D.

Figure 20:
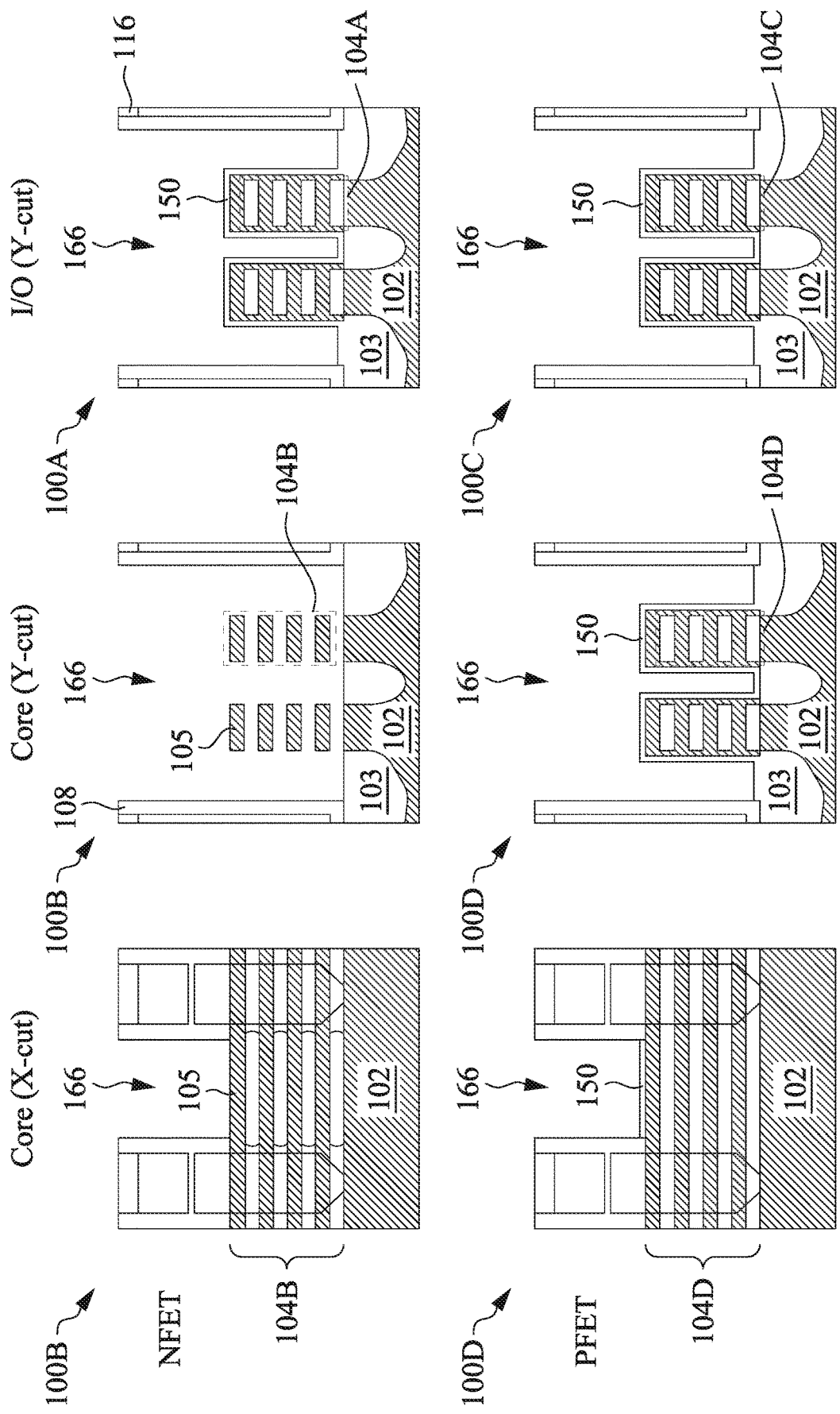

At operation 312, the method 300 (FIG. 7A) forms nanowires 150 in the NFET core device structure 100B, such as shown in FIG. 20. In an embodiment, the fins 104B may include an interfacial control layer, such as a silicon-cap, on the surfaces of the fins 104B. To further this embodiment, the operation 312 includes a step for removing the interfacial control layer, for example, by applying a wet etch with $NH_4OH$ or TMAH-based etchants, or by applying a dry etch with $NH_3$ and $H_2$ gas mixture. In the present embodiment, the layers 105 include silicon, and the layers 106 include silicon germanium. To further this embodiment, the operation 312 includes a dry etching process to selectively remove the layers 106 from the channel region of the device structure 100B. For example, the dry etching process may apply an HCl gas at a temperature of 500 to 700° C., or apply a gas mixture of $CF_4$, $SF_6$, and $CHF_3$. Since the dummy interfacial layer 150 covers the fins 104A, 104C, and 104D, the operation 312 only forms the nanowires 105 in the device structure 100B.

Figure 21:
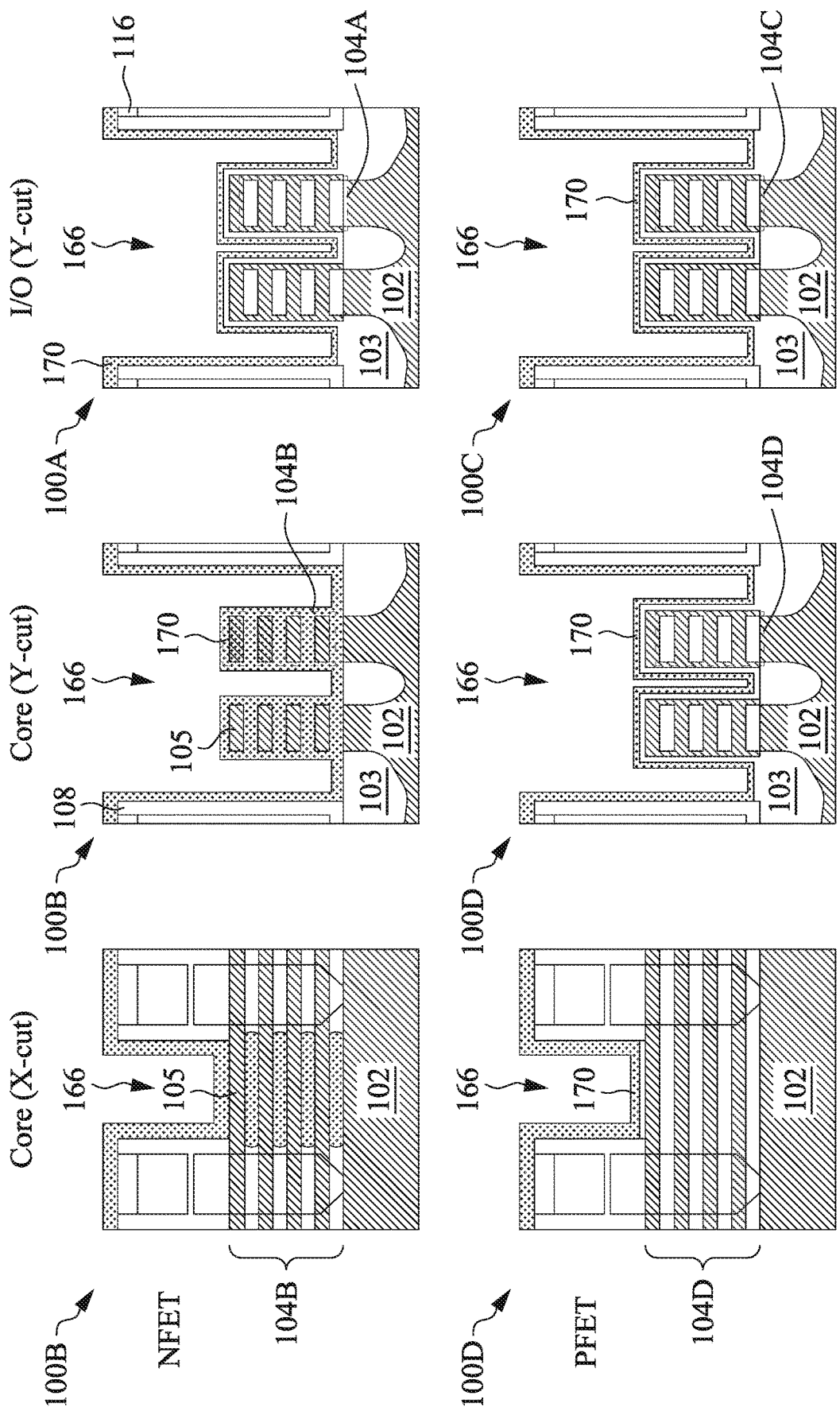

At operation 314, the method 300 (FIG. 7A) forms a passivation layer 170 covering the various device structures 100A, 100B, 100C, and 100D, as shown in FIG. 21. In an embodiment, the passivation layer 170 includes a layer of nitride over a layer of oxide. For example, the layer of oxide may include silicon dioxide ($SiO_2$), alumina ($Al_2O_3$), aluminum silicon oxide (AlSiO), hafnium silicon oxide (HfSiO), and other type of oxide; and the layer of nitride may include silicon nitride ($Si_3N_4$), silicon oxynitride (SiON), silicon carbide nitride (SiCN), silicon carbide oxynitride (SiCON), and other type of nitride. Each layer in the passivation layer 170 may be formed by CVD, PVD, ALD, or other suitable deposition methods.

Figure 22:
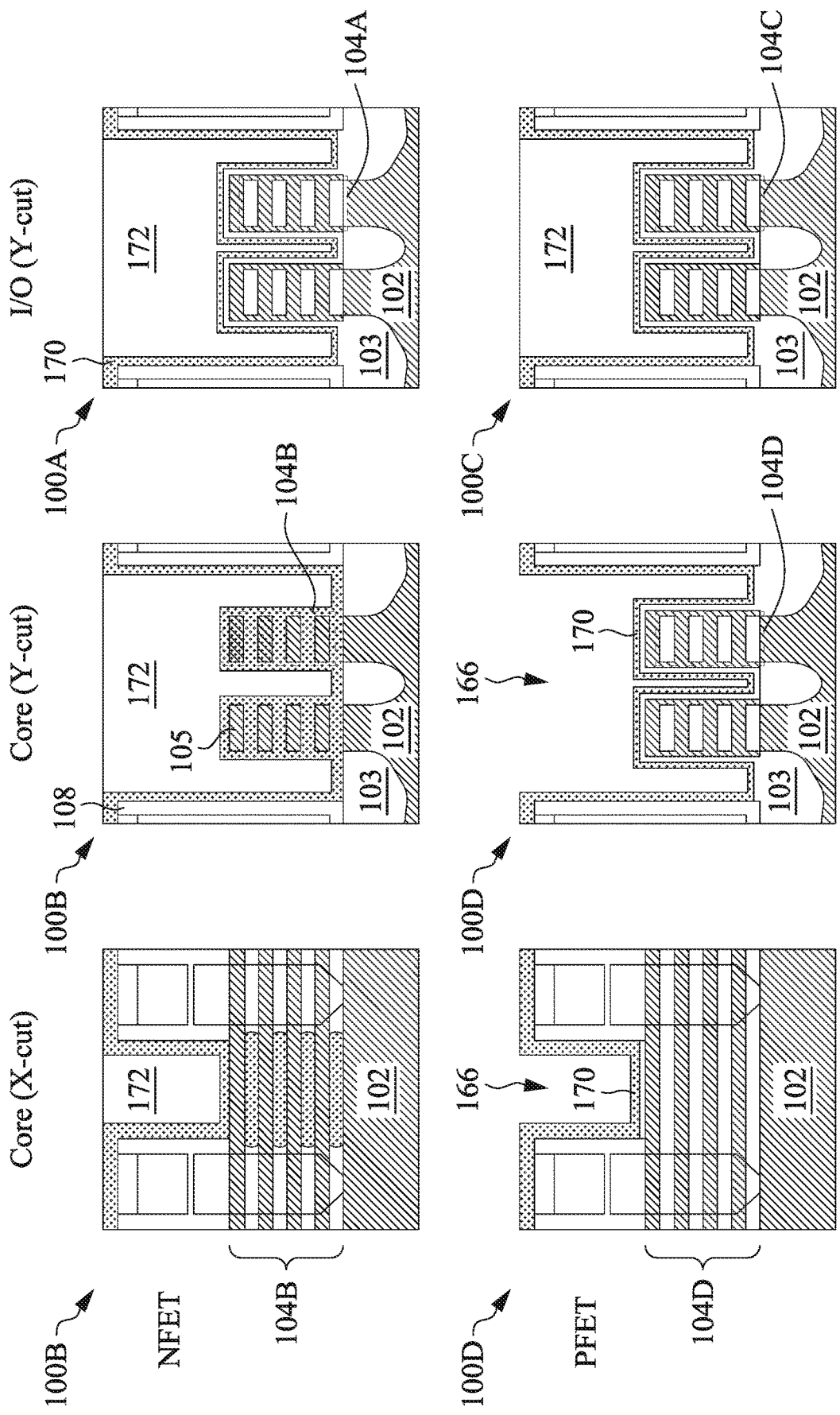

At operation 316, the method 300 (FIG. 7B) forms an etch mask 172 covering the NFET I/O device structure 100A, the NFET core device structure 100B, and the PFET I/O device structure 100C, as shown in FIG. 22. The PFET core device structure 100D is exposed through the etch mask 172. The etch mask 172 may be a patterned photoresist, similar to the etch mask 168.

At operation 318, the method 300 (FIG. 7B) removes the passivation layer 170 from the PFET core device structure 100D, thereby exposing the dummy interfacial layer 150 therein. In an embodiment, the operation 318 may include one or more etching processes to remove the passivation layer 170. For example, the operation 318 may use a wet etchant having $H_3PO_4$ to remove the nitride layer in the passivation layer 170, and then use a wet etchant having an HF-based solution (e.g., a mixture of HF and $NH_4F$), $NH_4OH$, or TMAH to remove the oxide layer in the passivation layer 170. Further, the operation 318 may apply a dry etching (e.g., using $NH_3$ and $H_2$ gas mixture) instead of a wet etching to remove the oxide layer in the passivation layer 170.

Figure 23:
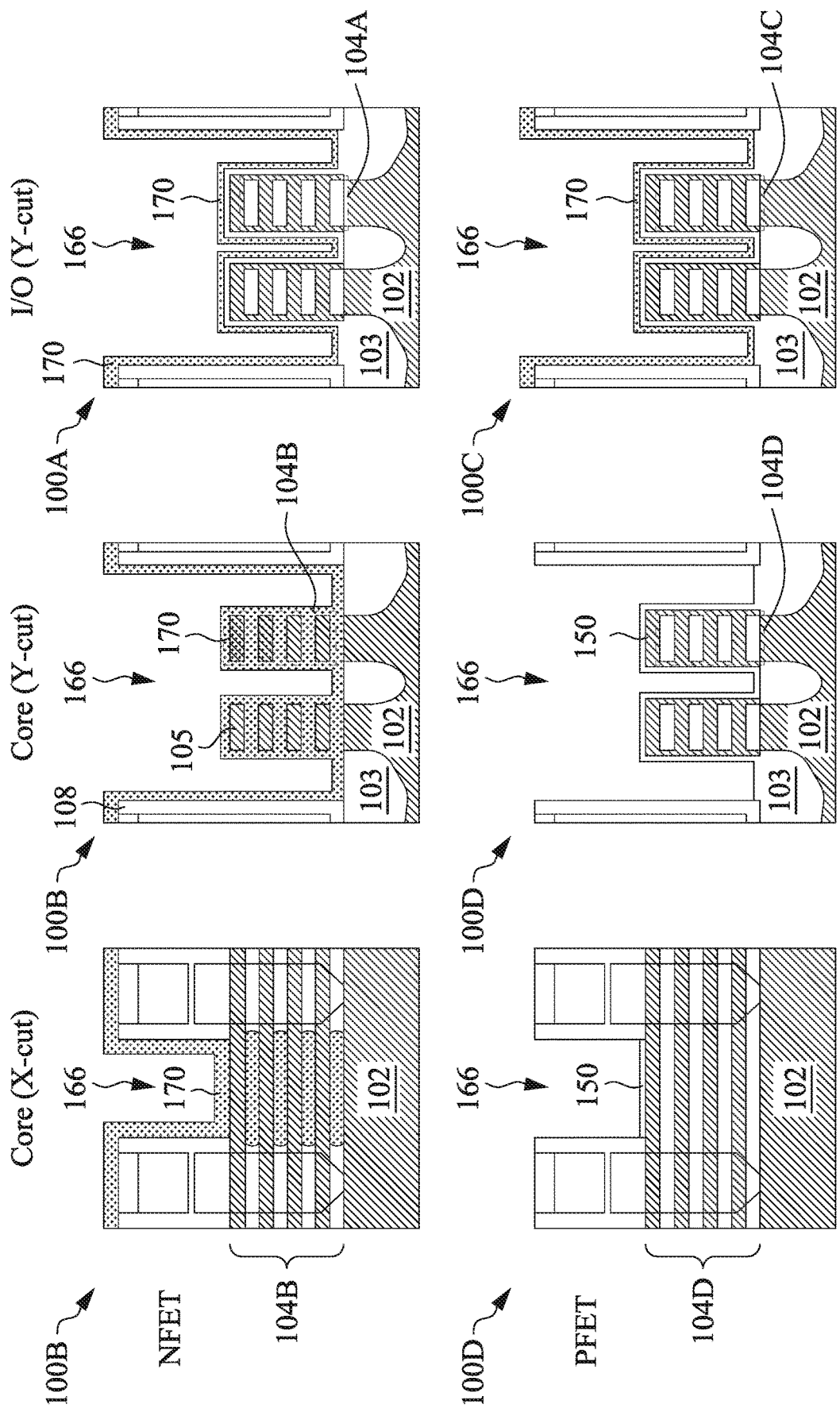

At operation 320, the method 300 (FIG. 7B) removes the etch mask 172 from the various structures. In an embodiment, the operation 320 may apply an ashing process or a stripping process to remove the etch mask 172. After the operations 318 and 320, the resultant device structures are shown in FIG. 23.

At operation 322, the method 300 (FIG. 7B) removes the dummy interfacial layer 150 from the PFET core device structure 100D, for example, by wet etching, dry etching, reactive ion etching, or other suitable etching methods, similar to the operation 308. During this operation, the passivation layer 170 covers the NFET I/O device structure 100A, the NFET core device structure 100B, and the PFET I/O device structure 100C.

Figure 24:
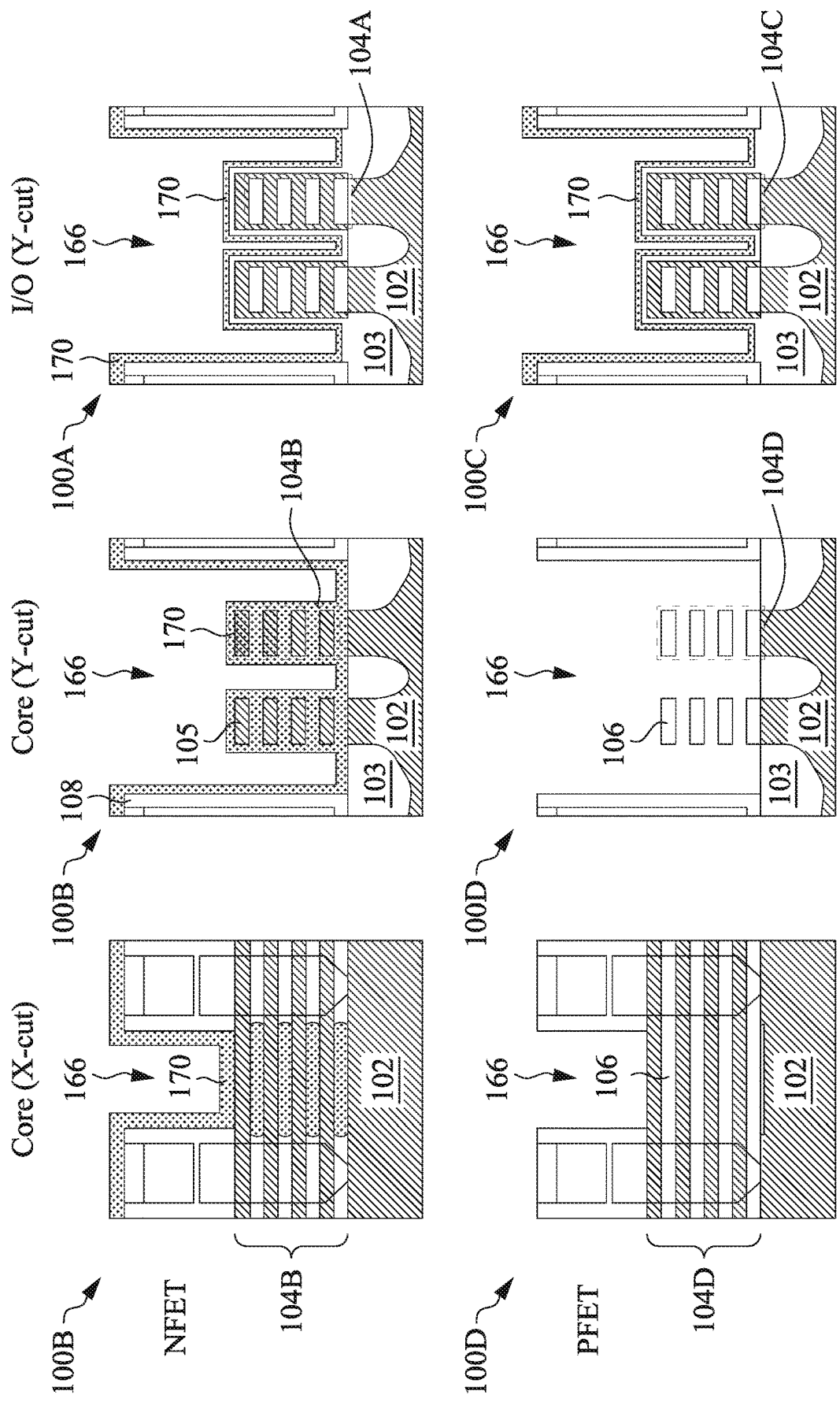

At operation 324, the method 300 (FIG. 7B) forms nanowires in the PFET core device structure 100D. In an embodiment, the fins 104D may include an interfacial control layer, such as a silicon-cap, on the surfaces of the fins 104D. To further this embodiment, the operation 324 includes a step for removing the interfacial control layer, such as discussed with reference to the operation 312. In the present embodiment, the layers 105 include silicon, and the layers 106 include silicon germanium. To further this embodiment, the operation 324 may include a dry etching process to selectively remove the layers 105 from the channel region of the device structure 100D. For example, the dry etching process may apply a gas mixture of $NH_3$ and $H_2$. Alternatively, the operation 324 may include a wet etching process to selectively remove the layers 105 from the channel region of the device structure 100D. For example, the wet etching process may apply $NH_4OH$ or TMAH-based wet etchant(s). After the operations 322 and 324, the resultant device structures are shown in FIG. 24.

At operation 326, the method 300 (FIG. 7B) removes the passivation layer 170 from the various structures, for example, by using methods discussed with reference to the operation 318. The resultant device structures are shown in FIG. 25.

At operation 328, the method 300 (FIG. 7B) removes the dummy interfacial layer 150 from the NFET I/O device structure 100A and the PFET I/O device structure 100C, similar to the operation 308. The operation 328 applies a selectively etching process, where the etchant(s) selectively remove the dummy interfacial layer 150 while keep the features 104A, 104C, 105, and 106 substantially intact. The resultant device structures are shown in FIG. 26.

Figure 27:
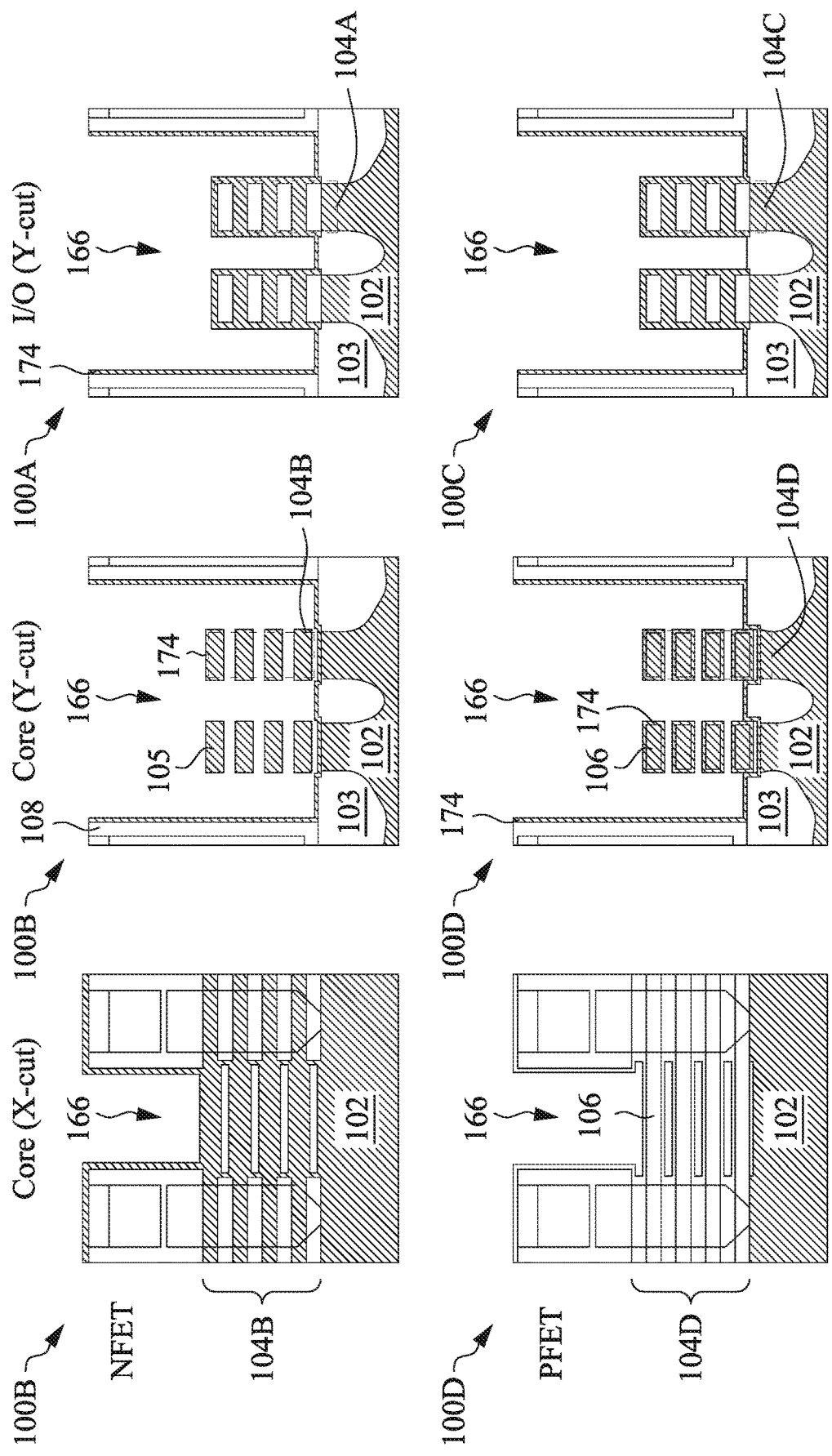

At operation 204, the method 200 (FIG. 6A) forms an interfacial control layer 174 in the gate trenches 166. Referring to FIG. 27, in the present embodiment, the interfacial control layer 174 is formed over the stack fin channels 104A and 104C, and the nanowires 104B and 104D. The interfacial control layer 174 may also be deposited directly over the isolation structure 103, the gate spacers 108, and top surfaces of the various structures 100A, 100B, 100C, and 100D. In an embodiment, the interfacial control layer 174 may comprise silicon and may be formed by CVD epitaxy. In another embodiment, the interfacial control layer 174 may comprise Si—S(silicon-sulfur) bonds and SiGe—S(silicon germanium-sulfur) bonds and may be formed by treating the various surfaces with a sulfur containing chemical. In yet another embodiment, the interfacial control layer 174 may comprise Si—N(silicon-nitrogen) bonds and SiGe—N (silicon germanium-nitrogen) bonds and may be formed by treating the various surfaces with a nitrogen containing chemical, such as $NH_3$ gas. In various embodiments, the interfacial control layer 174 may be formed to have a thickness less than 1 nm. The interfacial control layer 174 helps improve the flatness of the various surfaces for the subsequent deposition of the interfacial layer 120. In some embodiments of the method 200, the operation 204 is optional and may be bypassed.

Figure 28:
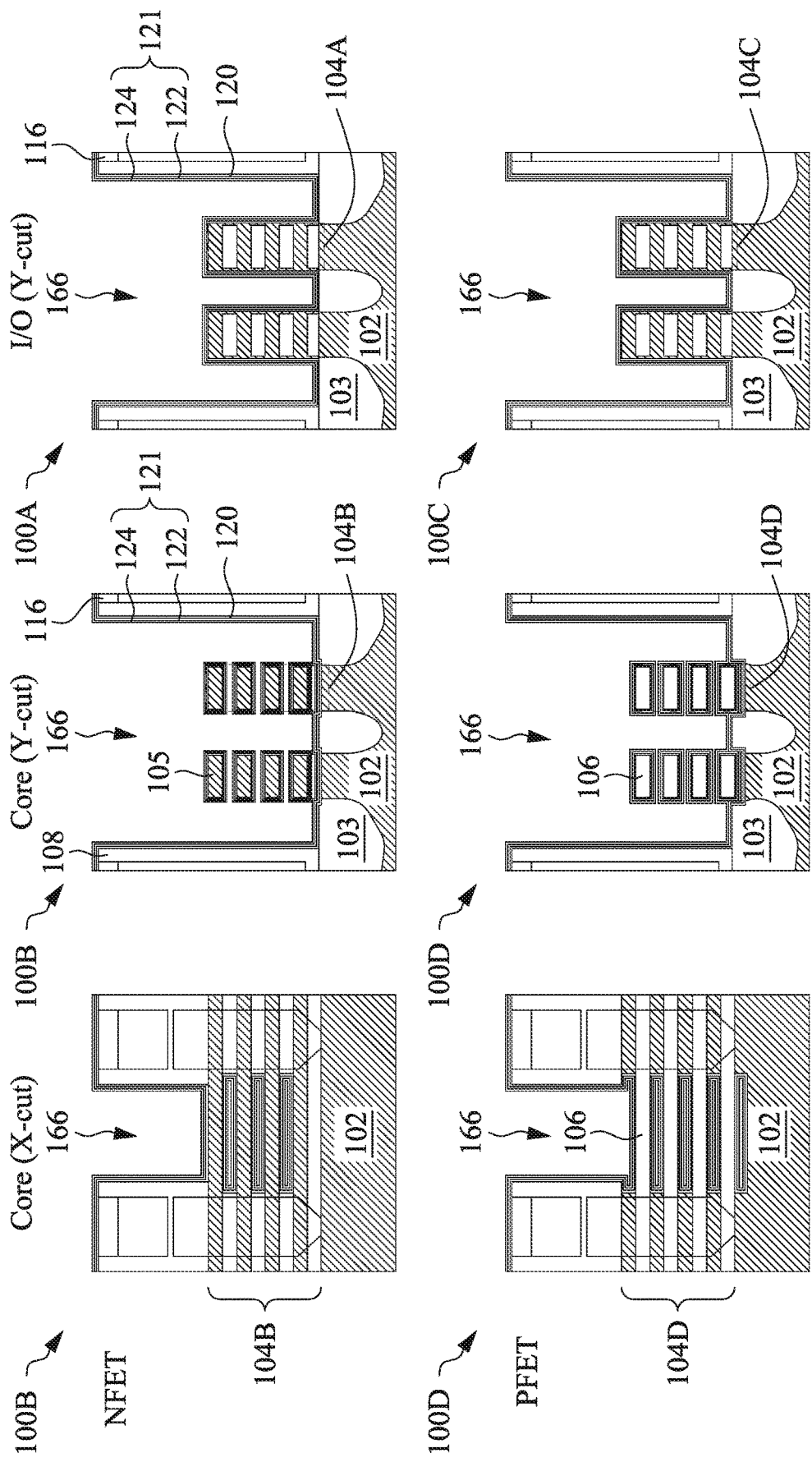

At operation 206, the method 200 (FIG. 6A) deposits the interfacial layer 120 over the interfacial control layer 174 in the gate trenches 166 (FIG. 28). At operation 208, the method 200 (FIG. 6A) deposits the high-k dielectric stack 121 (which includes one or more high-k dielectric layers) over the interfacial layer 120 (FIG. 28). Referring to FIG. 28, in the device structures 100A and 100C, the interfacial layer 120 and the high-k dielectric stack 121 are deposited over the top and sidewall surfaces of the stack fins 104A and 104C, over the top surface of the isolation structure 103, and on sidewalls of the gate spacer 108. In the device structures 100B and 100D, the interfacial layer 120 and the high-k dielectric stack 121 are deposited around the surfaces of the nanowires 104B and 104D, over the top surface of the isolation structure 103, and on sidewalls of the gate spacer 108. The interfacial layer 120 and the high-k dielectric stack 121 are deposited as substantially conformal layers in the present embodiment.

The interfacial layer 120 may include silicon dioxide ($SiO_2$), alumina ($Al_2O_3$), aluminum silicon oxide (AlSiO), silicon oxynitride (SiON), or other suitable materials, and may be deposited using chemical oxidation, thermal oxidation, atomic layer deposition (ALD), chemical vapor deposition (CVD), and/or other suitable methods. Particularly, the interfacial layer 120 has a thickness of 8 to 12 Å in the present embodiment.

The high-k dielectric stack 121 includes one or more layers of high-k dielectric materials. In the embodiment shown, the high-k dielectric stack 121 includes two layers 122 and 124 of different high-k dielectric materials. Each of the two layers 122 and 124 may include a high-k dielectric material such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), and strontium titanate ($SrTiO_3$). In a particular embodiment, the layer 122 includes hafnium oxide ($HfO_2$) of 10 to 20 Å and the layer 124 includes alumina ($Al_2O_3$) of 5 to 20 Å. In another embodiment (not shown), the high-k dielectric stack 121 includes three layers of different high-k dielectric materials, for example, a layer of $Al_2O_3$ over a layer of $HfO_2$ over a layer of HfSiO. In yet another embodiment, the high-k dielectric stack 121 has only a single layer of high-k dielectric material, such as a layer of $HfO_2$ of 30 to 40 Å. The high-k dielectric stack 121 may be deposited using, CVD, ALD and/or other suitable methods.

Figure 29:
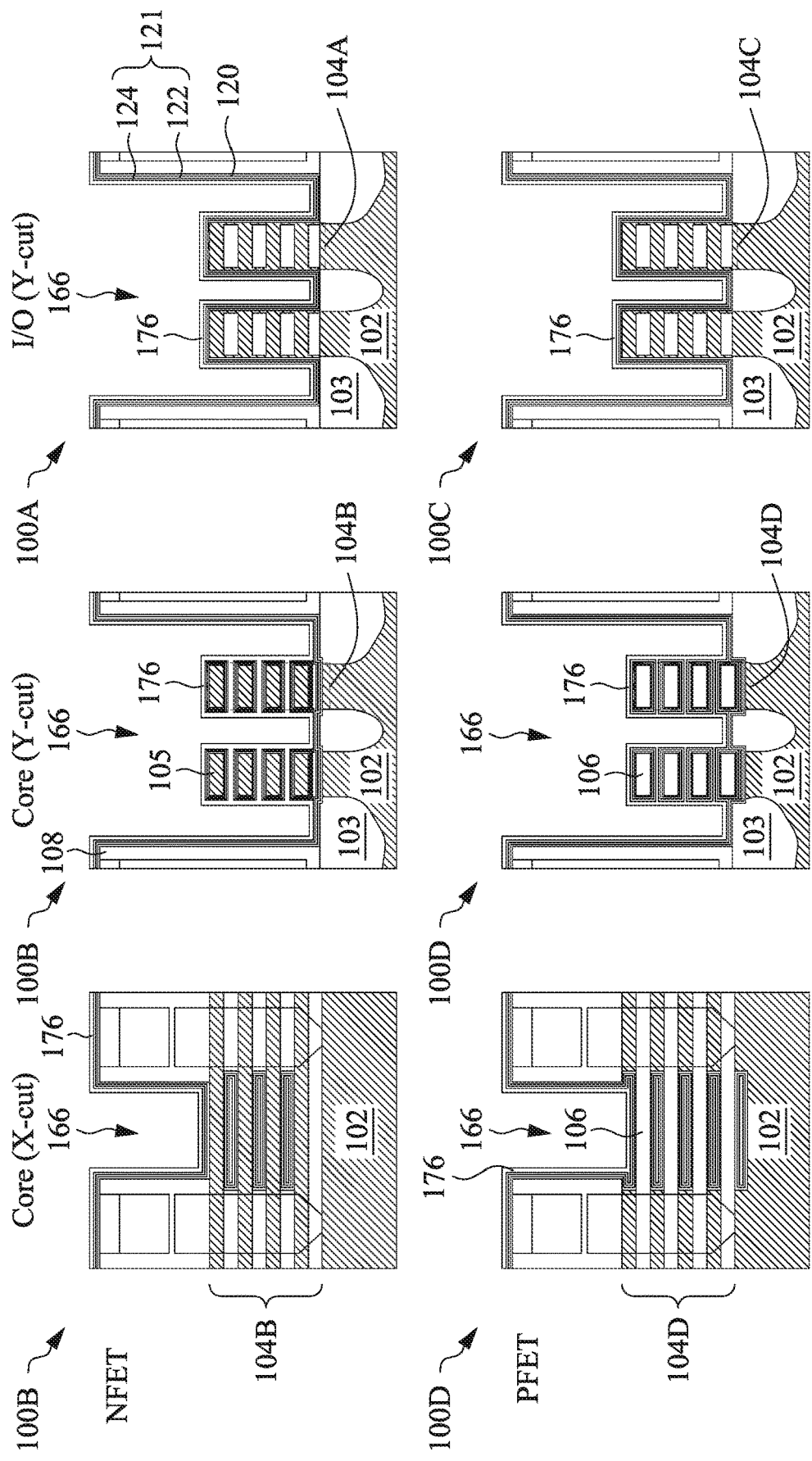

At operation 210, the method 200 (FIG. 6A) forms a hard mask 176 covering the device structures 100A, 100B, 100C, and 100D, as shown in FIG. 29. In an embodiment, the hard mask 176 may comprise a metal nitride such as titanium nitride (TiN), and may be deposited using CVD, PVD, ALD, or other suitable methods.

Figure 30:
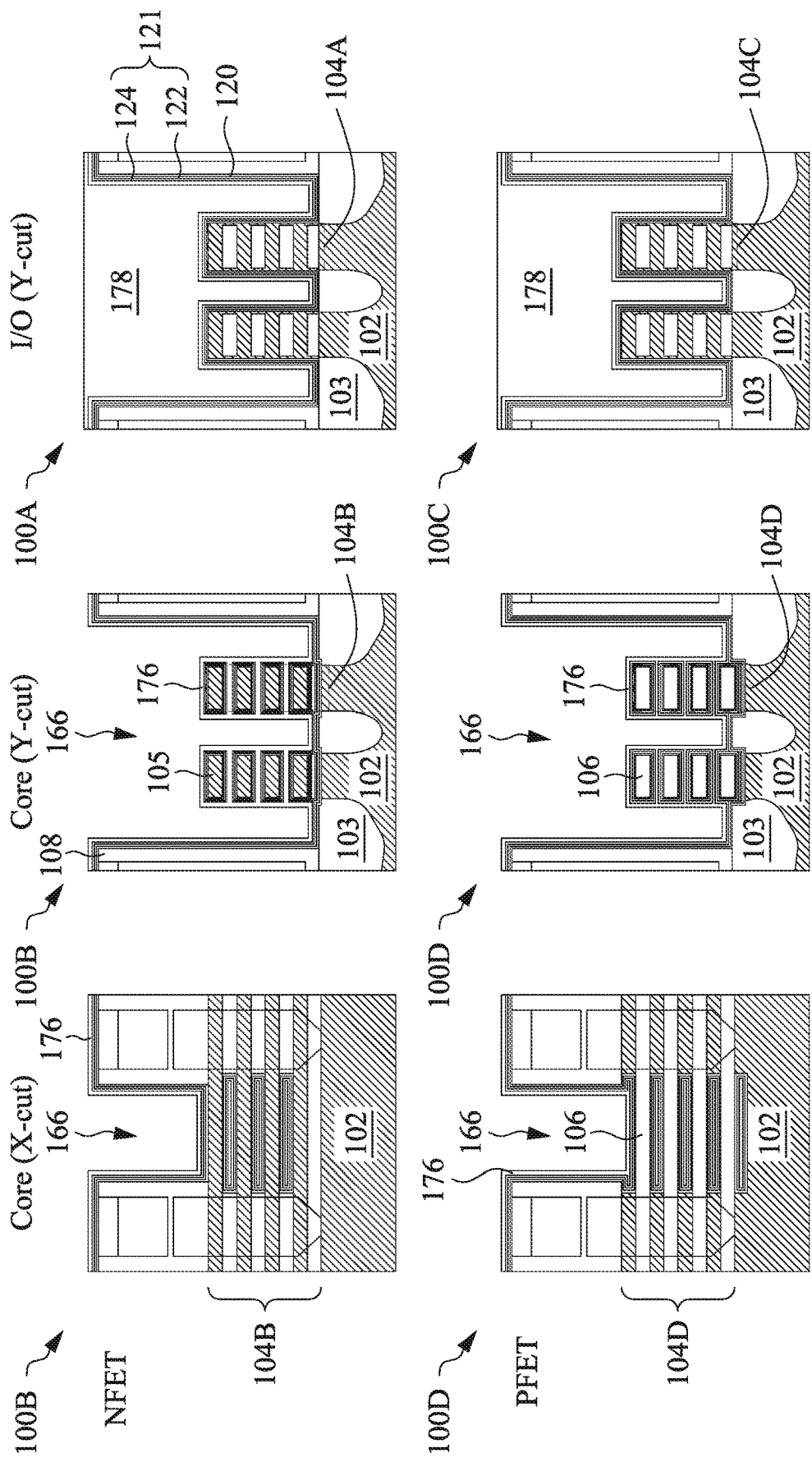

At operation 212, the method 200 (FIG. 6A) forms an etch mask 178 covering the NFET I/O device structure 100A and the PFET I/O device structure 100C, leaving the NFET core device structure 100B and the PFET core device structure 100D exposed through the etch mask 178. Referring to FIG. 30, in the present embodiment, the etch mask 178 may be a patterned photoresist formed by photoresist coating, exposing, post-exposure baking, and developing in one example. In the present embodiment, the hard mask 176 prevents the photoresist 178 from directly contacting the high-k dielectric stack 121 because such direct contacting might have introduced defects into the high-k dielectric stack 121.

Figure 31:
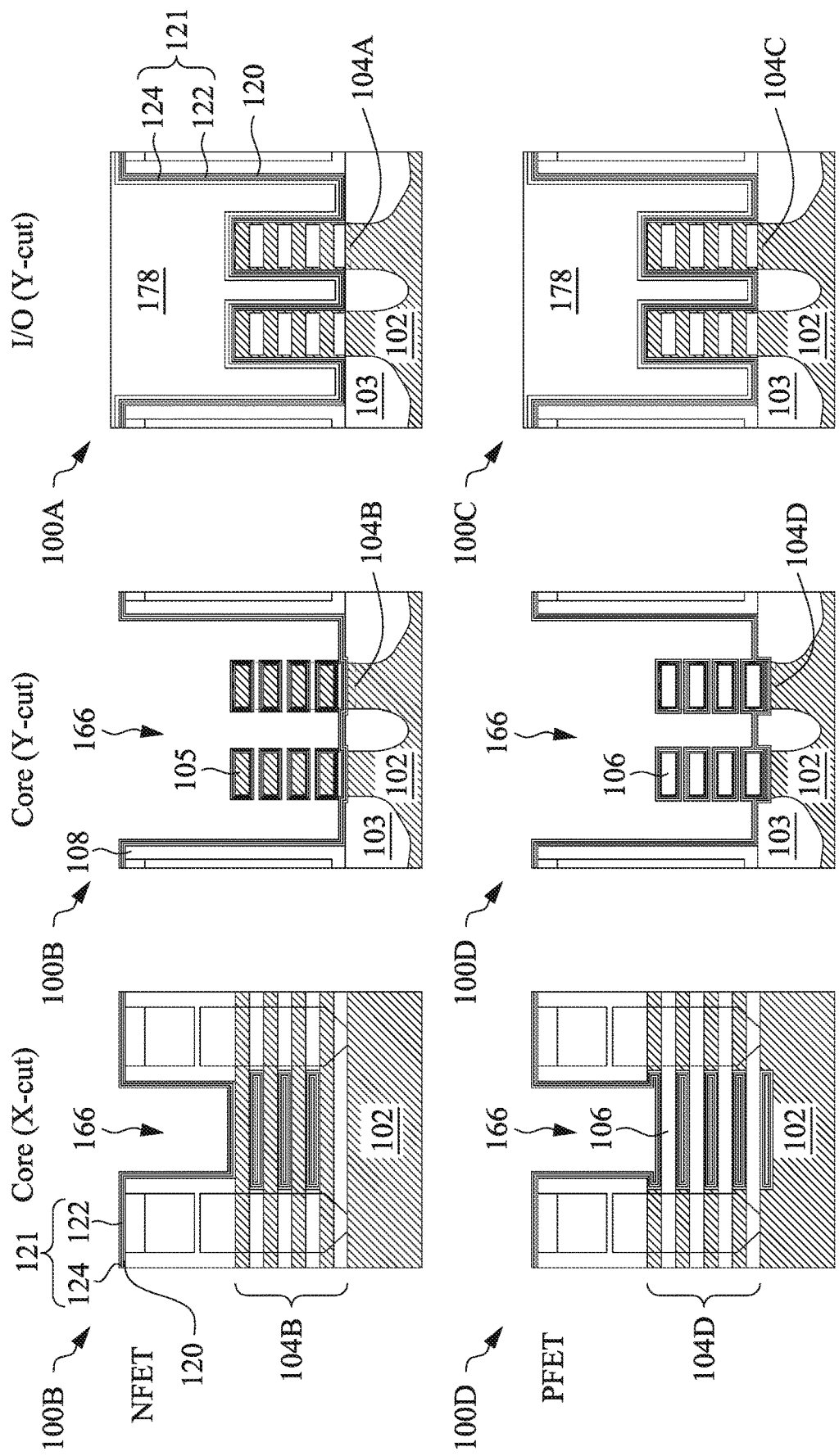

At operation 214, the method 200 (FIG. 6A) removes the hard mask 176 from the NFET core device structure 100B and the PFET core device structure 100D. The operation 214 may remove the hard mask 176 using, for example, an HF-based acidic solution, an $H_2O_2$-based solution, a sulfuric-peroxide mixture (SPM), or other oxidizers. The resultant device structures are shown in FIG. 31, where the high-k dielectric stack 121 is exposed in the device structures 100B and 100D.

Figure 32:
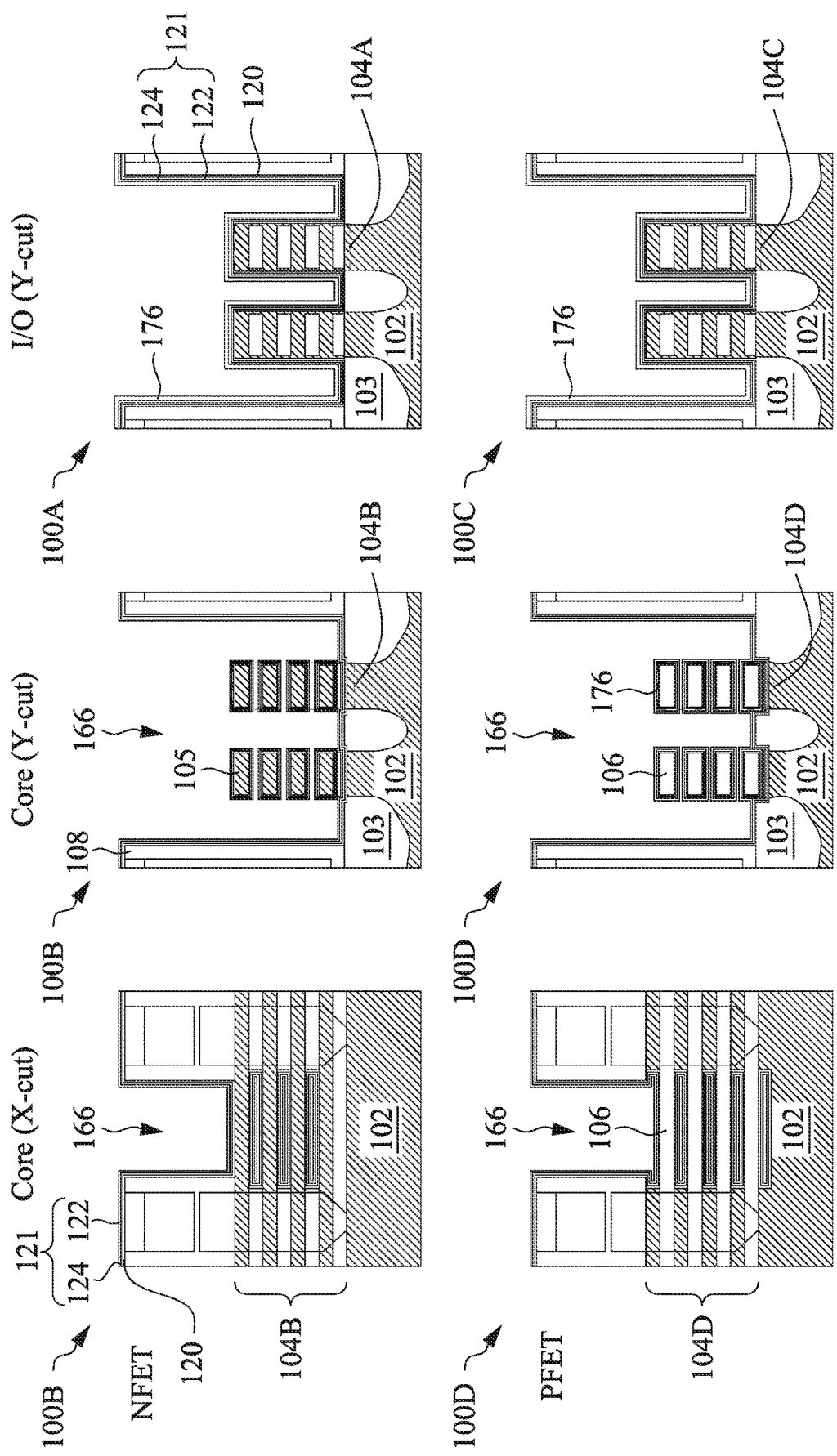

At operation 216, the method 200 (FIG. 6B) removes the etch mask 178 from the NFET I/O device structure 100A and the PFET I/O device structure 100C. The operation 216 may use ashing or stripping to remove the etch mask 178 in one example. The resultant device structures are shown in FIG. 32, where the high-k dielectric stack 121 is exposed in the device structures 100B and 100D and the hard mask 176 covers the device structures 100A and 100C.

Figure 33:
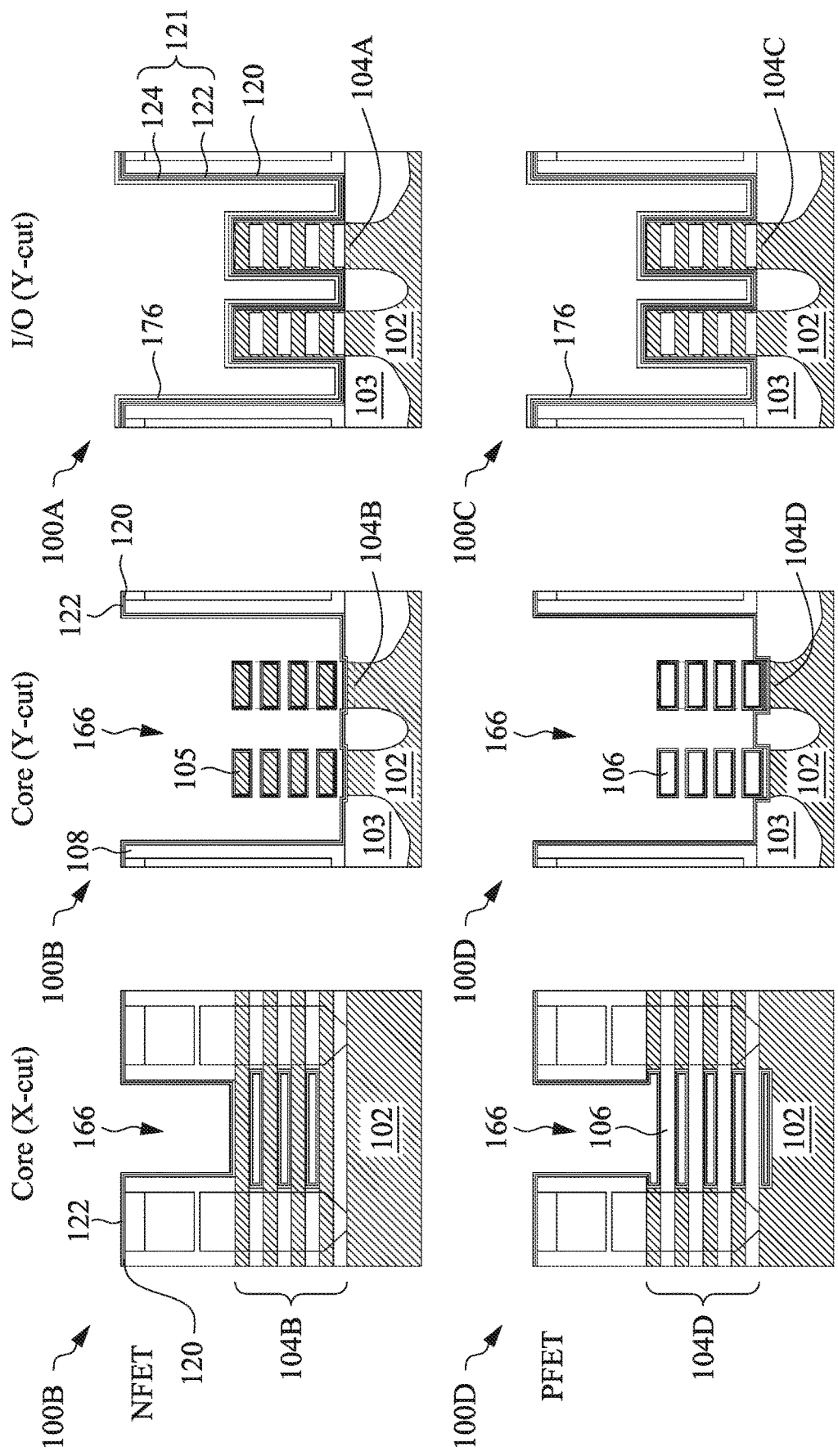

At operation 218, the method 200 (FIG. 6B) partially removes the high-k dielectric stack 121 in the NFET core device structure 100B and the PFET core device structure 100D, while the hard mask 176 protects the device structures 100A and 100C. Referring to FIG. 33, the high-k dielectric stack 121 is partially removed from the device structures 100B and 100D (in this example, the layer 124 is removed). In an embodiment, one or more topmost layers in the high-k dielectric stack 121 are removed by the operation 218. To further this embodiment, the operation 218 applies one or more etching processes to selectively remove the one or more topmost layers while keeping other layers intact. In an example, the high-k dielectric stack 121 includes a layer of $Al_2O_3$ over a layer of $HfO_2$. The operation 218 may apply a wet etchant having DHF (diluted hydrofluoric) or a mixture of HF and $NH_4F$ to selectively remove the layer of $Al_2O_3$, where the layer of $HfO_2$ has good resistance to such etchant. In another embodiment, the topmost layer in the high-k dielectric stack 121 is only partially removed by the operation 218. In an example not shown, the high-k dielectric stack 121 is a single layer of $HfO_2$. The operation 218 may apply a wet etching process, a dry etching process, a reactive ion etching process, or an atomic layer etching process to partially recess the single layer of $HfO_2$, for example, by 5 to 20 Å. The operation 218 may control the depth of etching through a timer or using other suitable methods.

Figure 34:
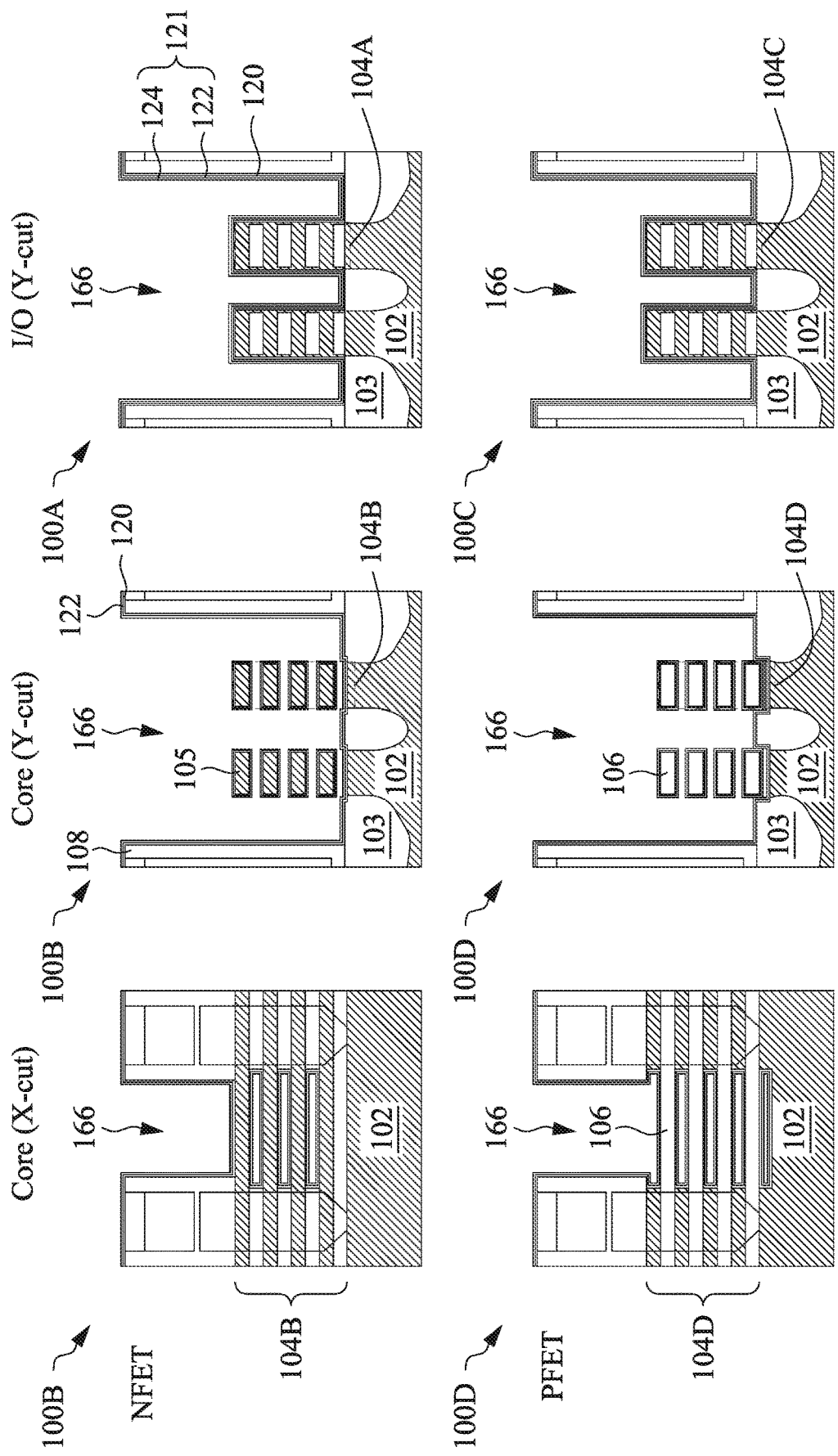

At operation 220, the method 200 (FIG. 6B) removes the hard mask 176 from the NFET I/O device structure 100A and the PFET I/O device structure 100C. The resultant device structures are shown in FIG. 34, where the high-k dielectric stack 121 is exposed in the I/O device structures 100A and 100C, and partial high-k dielectric stack 121 (the layer 122 in this example) is exposed in the core device structures 100B and 100D. In the present embodiment, the operation 220 applies etchant(s) that selectively remove the hard mask 176 while keeping the layer 124 (in the I/O device structures 100A and 100C) and the layer 122 (in the core device structures 100B and 100D) substantially intact. In an example, the hard mask 176 includes titanium nitride and the operation 220 may apply a DHF-based or $H_2O_2$-based etchant to selectively remove the hard mask 176.

Figure 35:
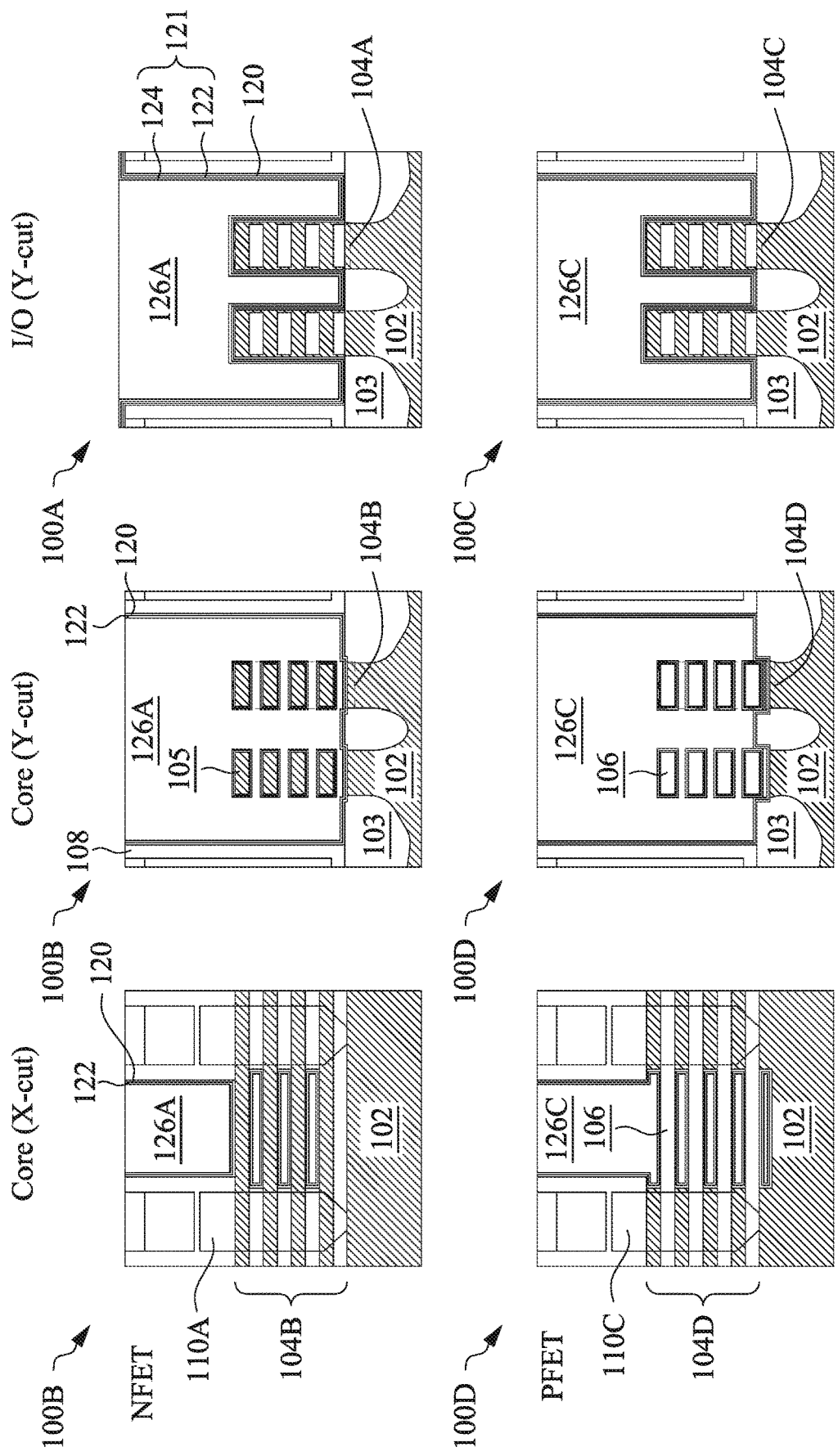

At operation 222, the method 200 (FIG. 6B) deposits one or more conductive layers in the gate trenches 166. Referring to FIG. 35, the one or more conductive layers 126A and 126C are filled into the gate trenches 166 (FIG. 34) and directly over the high-k dielectric layers 124 and 122. For the NFET device structures 100A and 100B, the conductive layers 126A may include one or more n-type work function metals and a metal fill layer. For the PFET device structures 100C and 100D, the conductive layers 126C may include one or more p-type work function metals and a metal fill layer. The metal fill layer in the NFET and PFET device structures may use the same material(s). The operation 222 may include multiple deposition and etching processes to deposit the conductive layers 126A and 126C for the respective NFET and PFET device structures. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The work function metal layers may include a plurality of layers and may be deposited by CVD, PVD, and/or other suitable process. The metal fill layer may include aluminum (Al), tungsten (W), cobalt (Co), copper (Cu), and/or other suitable materials; and may be formed by CVD, PVD, plating, and/or other suitable processes. The operation 222 may perform a CMP process to remove excess materials from the device structures 100A, 100B, 100C, and 100D so as to planarize a top surface of the respective device.

The method 200 (FIG. 6B) may perform further operations in order to form a final device. For example, the method 200 may form contacts and vias electrically connecting the S/D features 110A/C and the conductive layers 126A/C and form metal interconnects connecting various transistors to form a complete IC.

Although not intended to be limiting, one or more embodiments of the present disclosure provide many benefits to a semiconductor device and the formation thereof. For example, embodiments of the present disclosure form metal gate stacks without performing a high temperature post-oxidation annealing (POA) process. This advantageously improves S/D junction control. Further, metal gate stacks according to the present embodiments have very thin (e.g., 8-12 Å) silicon dioxide interfacial layer, which supports continuous scaling down of the I/O transistors. Still further, embodiments of the present disclosure form the same initial high-k dielectric layers in the gate stacks of I/O transistors and core transistors, and selectively remove some of the high-k dielectric layers from the core transistors in order to achieve different characteristics (such as TDDB and $V_{BA}$) in I/O and core transistors. This simplifies the IC manufacturing processes.

In one exemplary aspect, the present disclosure is directed to a semiconductor device. The semiconductor device includes a substrate; an I/O device over the substrate; and a core device over the substrate. The I/O device includes a first gate structure having an interfacial layer; a first high-k dielectric stack over the interfacial layer; and a conductive layer over and in physical contact with the first high-k dielectric stack. The core device includes a second gate structure having the interfacial layer; a second high-k dielectric stack over the interfacial layer; and the conductive layer over and in physical contact with the second high-k dielectric stack. The first high-k dielectric stack includes the second high-k dielectric stack and a third dielectric layer.

In an embodiment of the semiconductor device, the interfacial layer includes silicon dioxide ($SiO_2$) having a thickness ranging from 8 to 12 angstroms. In another embodiment, the first high-k dielectric stack is thicker than the second high-k dielectric stack by 5 to 20 angstroms. In yet another embodiment, the third dielectric layer has a dielectric constant greater than that of silicon dioxide ($SiO_2$) and lower than that of the second high-k dielectric stack. In another embodiment, the second high-k dielectric stack has a dielectric constant ranging from 15 to 30.

In an embodiment of the semiconductor device, the interfacial layer includes silicon dioxide ($SiO_2$) having a thickness ranging from 8 to 12 angstroms; the second high-k dielectric stack includes hafnium oxide ($HfO_2$) having a thickness ranging from 10 to 20 angstroms; and the third dielectric layer includes alumina ($Al_2O_3$) having a thickness ranging from 5 to 20 angstroms. In another embodiment, the first high-k dielectric stack and the second high-k dielectric stack have a substantially same dielectric constant.

In another embodiment of the semiconductor device, the I/O device includes a first channel under the first gate structure, the first channel having first and second semiconductor materials alternately stacked. In a further embodiment, the core device includes a second channel wrapped around by the second gate structure, the second channel having the first semiconductor material. In a further embodiment, the first semiconductor material includes silicon, germanium, or silicon germanium alloy.

In another exemplary aspect, the present disclosure is directed to a semiconductor device. The semiconductor device includes a substrate and an I/O device over the substrate. The I/O device includes a first gate structure having an interfacial layer having a thickness of 8 to 12 angstroms; one or more high-k dielectric layers over the interfacial layer; and a conductive layer over and in physical contact with the one or more high-k dielectric layers.

In an embodiment of the semiconductor device, the interfacial layer includes silicon dioxide ($SiO_2$), alumina ($Al_2O_3$), aluminum silicon oxide (AlSiO), or silicon oxynitride (SiON). In another embodiment, the one or more high-k dielectric layers include hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof.

In an embodiment of the semiconductor device, the I/O device further includes a first channel under the first gate structure, the first channel having stacked layers of semiconductor materials. In a further embodiment, the stacked layers of semiconductor materials include multiple layers of silicon and multiple layers of silicon germanium alternately stacked.

In an embodiment, the semiconductor device further includes a core device over the substrate. The core device includes a second gate structure having the interfacial layer; another one or more high-k dielectric layers over the interfacial layer; and the conductive layer over and in physical contact with the another one or more high-k dielectric layers. The one or more high-k dielectric layers include the another one or more high-k dielectric layers and at least one additional dielectric layer.

In yet another embodiment, the semiconductor device further includes a core device over the substrate. The core device includes a second gate structure having the interfacial layer; another one or more high-k dielectric layers over the interfacial layer; and the conductive layer over and in physical contact with the another one or more high-k dielectric layers. The one or more high-k dielectric layers is thicker than the another one or more high-k dielectric layers by 5 to 20 angstroms.

In another exemplary aspect, the present disclosure is directed to a method. The method includes providing an NFET I/O device structure, an NFET core device structure, a PFET I/O device structure, and a PFET core device structure, wherein each of the NFET I/O device structure and the PFET I/O device structure includes a gate trench and a stack fin exposed in the gate trench, wherein the stack fin includes first and second semiconductor materials alternately stacked, wherein each of the NFET core device structure and the PFET core device structure includes a gate trench and nanowires exposed in the gate trench. The method further includes depositing an interfacial layer over surfaces of the stack fin and the nanowires exposed through the respective gate trenches; depositing one or more high-k dielectric layers over the interfacial layer in each of the gate trenches; and forming a hard mask covering the one or more high-k dielectric layers in the NFET I/O device structure and the PFET I/O device structure, while exposing the one or more high-k dielectric layers in the NFET core device structure and the PFET core device structure. The method further includes partially removing the one or more high-k dielectric layers in the NFET core device structure and the PFET core device structure while the hard mask covers the one or more high-k dielectric layers in the NFET I/O device structure and the PFET I/O device structure, leaving a portion of the one or more high-k dielectric layers in the NFET core device structure and the PFET core device structure. The method further includes removing the hard mask from the NFET I/O device structure and the PFET I/O device structure; and depositing one or more conductive layers over the one or more high-k dielectric layers in the NFET I/O device structure and the PFET I/O device structure and over the portion of the one or more high-k dielectric layers in the NFET core device structure and the PFET core device structure.

In an embodiment of the method, the one or more high-k dielectric layers include a first high-k dielectric layer and a second high-k dielectric layer over the first high-k dielectric layer. In a further embodiment, the partially removing of the one or more high-k dielectric layers completely removes the second high-k dielectric layer.

In an embodiment, the method further includes forming an interfacial control layer over the surfaces of the stack fin and the nanowires exposed through the respective gate trenches, wherein the interfacial layer is deposited over the interfacial control layer.

In another embodiment of the method, the forming of the hard mask includes forming a hard mask layer over the one or more high-k dielectric layers in each of the gate trenches; forming a resist mask covering the hard mask layer in the NFET I/O device structure and the PFET I/O device structure, while exposing the hard mask layer in the NFET core device structure and the PFET core device structure; and removing the hard mask layer in the NFET core device structure and the PFET core device structure while the resist mask covers the hard mask layer in the NFET I/O device structure and the PFET I/O device structure.

In yet another exemplary aspect, the present disclosure is directed to a semiconductor device. The semiconductor device includes a substrate; and an I/O device over the substrate. The I/O device includes a stack fin channel having two semiconductor materials alternately stacked. The I/O device further includes a first gate structure engaging the stack fin channel. The first gate structure includes an interfacial layer having a thickness of 8 to 12 angstroms; a first high-k dielectric stack over the interfacial layer; and a conductive layer over and in physical contact with the first high-k dielectric stack.

In an embodiment of the semiconductor device, the first high-k dielectric stack includes a layer of hafnium oxide ($HfO_2$) and a layer of alumina ($Al_2O_3$) over the layer of $HfO_2$. In a further embodiment, the semiconductor device further includes a layer of hafnium silicon oxide (HfSiO) between the interfacial layer and the layer of $HfO_2$.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having an I/O region and a core region;
    a first transistor in the I/O region; and
    a second transistor in the core region, wherein the second transistor has a breakdown voltage lower than the first transistor,
    wherein the first transistor includes a first gate structure having:
        an interfacial layer;
        a first high-k region over and in physical contact with the interfacial layer, the first high-k region including an aluminum oxide layer; and
        a conductive layer over the first high-k region and in physical contact with the aluminum oxide layer,
    wherein the second transistor includes a second gate structure having:
        the interfacial layer;
        a second high-k region over and in physical contact with the interfacial layer, the second high-k region being free of aluminum; and
        the conductive layer over and in physical contact with the second high-k region,
    wherein the first high-k region is thicker than the second high-k region,
    wherein the first transistor includes a first channel under the first gate structure, the first channel having first and second semiconductor materials alternately stacked, and
    wherein the first transistor includes a first source/drain (S/D) feature in physical contact with both the first and second semiconductor materials in the first channel of the first transistor.

2. The semiconductor device of claim 1, wherein the first high-k region is thicker than the second high-k region by 5 to 20 angstroms.

3. The semiconductor device of claim 1, wherein a bottom portion of the first high-k region proximal to the interfacial layer and the second high-k region have a substantially same dielectric constant.

4. The semiconductor device of claim 1, wherein the first high-k region includes at least one high-k material that is also included in the second high-k region.

5. The semiconductor device of claim 4, wherein the at least one high-k material includes hafnium oxide.

6. The semiconductor device of claim 4, wherein the at least one high-k material includes hafnium silicon oxide and hafnium oxide.

7. The semiconductor device of claim 1, wherein:
    the interfacial layer has a thickness ranging from 8 to 12 angstroms;
    the second high-k region has a thickness ranging from 10 to 20 angstroms; and
    the first high-k region is thicker than the second high-k region by 5 to 20 angstroms.

8. The semiconductor device of claim 1, wherein the second transistor includes a second channel wrapped around by the second gate structure, the second channel having the first semiconductor material.

9. The semiconductor device of claim 1, wherein the first transistor is configured to operate under a first power supply voltage, the second transistor is configured to operate under a second power supply voltage, and the first power supply voltage is higher than the second power supply voltage.

10. A semiconductor device, comprising:
    a substrate;
    an I/O device over the substrate, wherein the I/O device includes a stacked fin including first and second semiconductor layers alternately stacked, an interfacial layer over and in physical contact with the stacked fin, a first high-k region over and in physical contact with the interfacial layer, a conductive layer over and in physical contact with the first high-k region, and an epitaxial feature in a source/drain (S/D) region of the I/O device and in physical contact with both the first and second semiconductor layers of the stacked fin; and
    a core device over the substrate, wherein the core device has a breakdown voltage lower than the I/O device, wherein the core device includes a plurality of nanowires, the interfacial layer wrapping around and in physical contact with each nanowire, a second high-k region wrapping around and in physical contact with the interfacial layer, and the conductive layer wrapping around and in physical contact with the second high-k region,
    wherein the first high-k region is thicker than the second high-k region for at least an aluminum-containing layer that is free in the second high-k region.

11. The semiconductor device of claim 10, wherein the stacked fin has first and second semiconductor materials alternately stacked, and the plurality of nanowires includes the first semiconductor material.

12. The semiconductor device of claim 11, wherein the first semiconductor material includes silicon, germanium, or silicon germanium alloy.

13. The semiconductor device of claim 10, wherein the interfacial layer includes silicon dioxide having a thickness ranging from 8 to 12 angstroms.

14. The semiconductor device of claim 10, wherein the first high-k region is thicker than the second high-k region by 5 to 20 angstroms.

15. The semiconductor device of claim 10, wherein each of the first and second high-k regions includes hafnium silicon oxide, hafnium oxide, alumina, zirconium oxide, lanthanum oxide, titanium oxide, yttrium oxide, strontium titanate, or a combination thereof.

16. A semiconductor device, comprising:
a substrate;
a p-type core device over the substrate, wherein the p-type core device includes a first nanowire and a first gate structure wrapping around the first nanowire, the first gate structure having:
an interfacial layer having a thickness of 8 to 12 angstroms and in physical contact with the first nanowire;
a high-k dielectric layer over and in physical contact with the interfacial layer, wherein a composition of the high-k dielectric layer is selected from the group consisting of hafnium silicon oxide, hafnium oxide, zirconium oxide, lanthanum oxide, titanium oxide, yttrium oxide, and strontium titanate; and
a conductive layer over and in physical contact with the high-k dielectric layer, wherein the high-k dielectric layer includes a metal oxide compound, and the metal oxide compound extends continuously from a first interface between the interfacial layer and the high-k dielectric layer to a second interface between the high-k dielectric layer and the conductive layer; and
an n-type I/O device over the substrate, wherein the n-type I/O device includes a stacked fin having first and second semiconductor layers alternately stacked, a source/drain (S/D) region in physical contact with both the first and second semiconductor layers of the stacked fin, and a second gate structure engaging the stacked fin, the second gate structure having:
the interfacial layer over and in physical contact with the stacked fin;
another high-k dielectric layer over and in physical contact with the interfacial layer; and
another conductive layer over and in physical contact with the another high-k dielectric layer, wherein the another high-k dielectric layer contains aluminum and is thicker than the high-k dielectric layer.

17. The semiconductor device of claim 16, wherein the another high-k dielectric layer is thicker than the high-k dielectric layer by 5 to 20 angstroms.

18. The semiconductor device of claim 17, wherein the high-k dielectric layer and the another high-k dielectric layer both include hafnium oxide.

19. The semiconductor device of claim 17, wherein the another high-k dielectric layer includes an aluminum oxide layer in physical contact with the conductive layer.

20. The semiconductor device of claim 16, wherein the high-k dielectric layer has a thickness ranging from 10 to 20 angstroms.

* * * * *